US009118195B2

(12) United States Patent
Foster

(10) Patent No.: US 9,118,195 B2
(45) Date of Patent: Aug. 25, 2015

(54) MOBILE COMMUNICATION DEVICE HOUSING

(71) Applicant: David A. Foster, Orange City, FL (US)

(72) Inventor: David A. Foster, Orange City, FL (US)

(*) Notice: Subject to any disclaimer, the term of this patent is extended or adjusted under 35 U.S.C. 154(b) by 447 days.

(21) Appl. No.: 13/720,617

(22) Filed: Dec. 19, 2012

(65) Prior Publication Data

US 2013/0106353 A1 May 2, 2013

Related U.S. Application Data

(63) Continuation-in-part of application No. 13/032,768, filed on Feb. 23, 2011, now Pat. No. 8,432,124.

(60) Provisional application No. 61/338,920, filed on Feb. 24, 2010.

(51) Int. Cl.
*H02J 7/00* (2006.01)
*H01M 2/10* (2006.01)
*H01M 10/46* (2006.01)
(Continued)

(52) U.S. Cl.
CPC ............ *H02J 7/0044* (2013.01); *H01L 31/0392* (2013.01); *H01M 2/1005* (2013.01); *H01M 10/4207* (2013.01); *H01M 10/465* (2013.01); *H01M 16/00* (2013.01); *H02S 40/38* (2014.12); *A45C 15/00* (2013.01); *A45C 2011/002* (2013.01); *A45C 2011/003* (2013.01); *A45C 2200/15* (2013.01); *H01M 2220/30* (2013.01); *H02J 7/355* (2013.01); *Y02B 10/10* (2013.01); *Y02E 10/50* (2013.01)

(58) Field of Classification Search
CPC ...... H02J 7/0044; H02J 7/0042; H02J 7/0045

USPC .......................................... 320/114, 113, 115
See application file for complete search history.

(56) References Cited

U.S. PATENT DOCUMENTS 5,052,943 A    10/1991   Davis
5,488,575 A *  1/1996    Danielson et al. ............ 713/321
(Continued)

FOREIGN PATENT DOCUMENTS

JP    10-137025       5/1998
JP    2001-149130     6/2001
(Continued)

OTHER PUBLICATIONS

PCT "Notification of Transmittal of the International Search Report and the Written Opinion of the International Searching Authority, or the Declaration for PCT/US2012/026117," mailed Sep. 27, 2012.

*Primary Examiner* — M'Baye Diao
(74) *Attorney, Agent, or Firm* — Weide & Miller, Ltd.

(57) ABSTRACT

A portable electronic device carrier includes a charging system. The carrier is configured to at least partially house a portable electronic device such as a cell phone, PDA or the like. The carrier may comprise a pouch or have other configurations. The charging system comprises at least one battery. The battery may be configured to be charged by an external source via at least one external port or connector, or a source associated with the carrier, such as at least one photovoltaic cell. The charging port may comprise contacts which are engaged by an interface of the portable electronic device. In accordance with the invention, a portable electronic device is charged using a portable charging system associated with a carrier for the device.

20 Claims, 13 Drawing Sheets

(51) Int. Cl.
   *H01M 10/42* (2006.01)
   *H01M 16/00* (2006.01)
   *H01L 31/0392* (2006.01)
   *H02S 40/38* (2014.01)
   *A45C 15/00* (2006.01)
   *H02J 7/35* (2006.01)
   *A45C 11/00* (2006.01)

(56) References Cited

U.S. PATENT DOCUMENTS

| | | | |
|---|---|---|---|
| 5,701,067 A | 12/1997 | Kaji et al. | |
| 5,855,692 A | 1/1999 | Kaji et al. | |
| 5,881,850 A * | 3/1999 | Murdoch | 190/110 |
| 5,915,020 A * | 6/1999 | Tilford et al. | 455/3.02 |
| 6,184,654 B1 | 2/2001 | Bachner et al. | |
| 6,266,685 B1 * | 7/2001 | Danielson et al. | 708/141 |
| 6,870,089 B1 | 3/2005 | Gray | |
| 6,977,479 B2 | 12/2005 | Hsu | |
| 7,295,865 B2 | 11/2007 | Wang | |
| 7,619,884 B1 | 11/2009 | Gray | |
| 2005/0140331 A1 | 6/2005 | McQuade | |
| 2006/0273757 A1 | 12/2006 | Ramez | |
| 2007/0201201 A1 * | 8/2007 | Daley, III | 361/683 |
| 2008/0210728 A1 | 9/2008 | Bihn | |
| 2009/0021214 A1 | 1/2009 | Foster et al. | |
| 2009/0102415 A1 | 4/2009 | Muchow et al. | |
| 2009/0160396 A1 | 6/2009 | Shyu et al. | |
| 2009/0284216 A1 | 11/2009 | Bessa et al. | |
| 2010/0093412 A1 | 4/2010 | Serra et al. | |
| 2011/0006725 A1 | 1/2011 | Wilson | |
| 2011/0140913 A1 * | 6/2011 | Montenero | 340/870.07 |

FOREIGN PATENT DOCUMENTS

| | | |
|---|---|---|
| KR | 10-1999-0045804 | 6/1999 |
| KR | 10-2010-0082920 | 7/2010 |

* cited by examiner

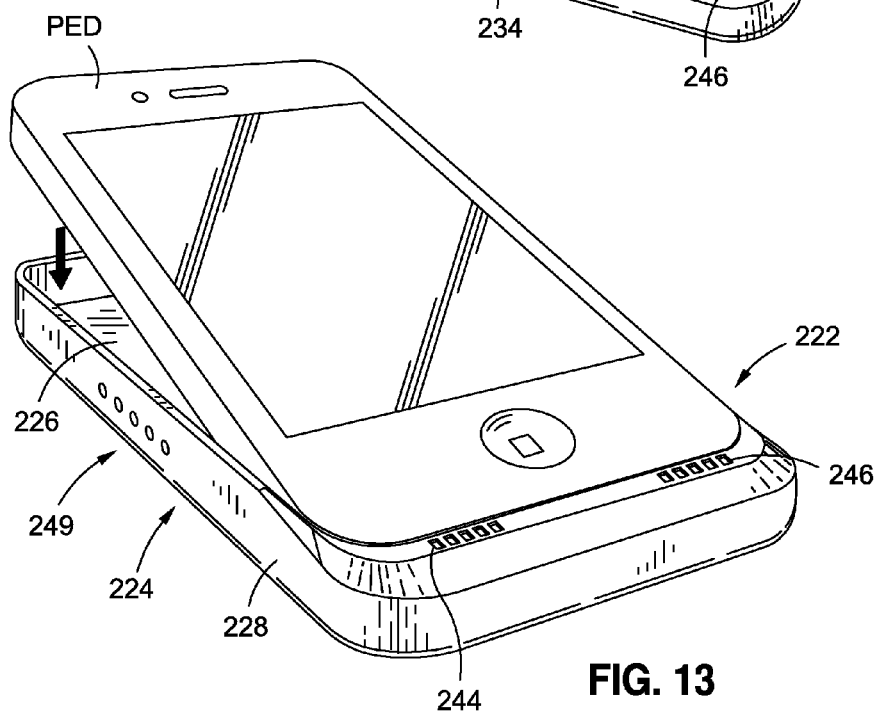

MOBILE COMMUNICATION DEVICE HOUSING

RELATED APPLICATION DATA

This application is a continuation-in-part application of U.S. patent application Ser. No. 13/032,768, filed Feb. 23, 2011, which claims priority to U.S. Provisional Patent Application Ser. No. 61/338,920, filed Feb. 24, 2010.

FIELD OF THE INVENTION

The present invention relates to electric chargers for portable electronic devices such as cell phones and PDAs.

BACKGROUND OF THE INVENTION

Cell phones, PDAs and other portable electronic devices are extremely prevalent. People are increasingly relying upon these devices for a range of purposes. For example, while cell phones were originally most commonly used by business travelers, they are now more widely used. For example, teens may carry cell phones in order to communicate with their parents in the event of an emergency, to communicate with their friends at school, or at home without tying up a home phone land line. In some cases, people are using their cell phone in replacement of their land lines. Similarly, PDAs have grown in popularity, owing to the range of functions they now provide.

One problem with these devices is, being portable, they are powered by a battery that requires frequent charging. Often, a user may find that their cell phone is not fully charged, and they may lose power during use. Loss of battery power to a PDA or cell phone can even result in loss of stored information.

Generally, these devices are charged by connecting them to a power source via a charging cable. Most commonly, these devices are provided with a "home" charging cable which allows the device to be charged via a 110V AC power source, such as the type commonly found in the home at a wall outlet. The device may also be provided with a "car" charger which allows the device to be charged via a 12V DC power source, such as the type commonly found in an automobile.

However, the device owner may forget their charger. For example, a traveler may forget to bring their home or car charger with them and arrive at a remote destination with no way to charge their device. Similarly, even if one charges their cell phone or PDA at home during the evening, the battery power may be depleted the next day when the device is used at school, at work or at another remote location. The user may then not be able to charge the device until they return home that evening.

One solution to this problem is to obtain an additional or backup battery. This battery may be charged at the same time as the main device battery and be transported with the device. If the main battery loses its charge, the second battery may be placed in the device. This, however, is a cumbersome solution to the problem. The solution requires one to purchase an expensive battery and keep that battery, like the battery in the main device, charged up. If one travels for a few days, the charge in both batteries may quickly be depleted, leaving the user without use of their device once again.

SUMMARY OF THE INVENTION

A portable electronic device carrier includes a charging system. The carrier is configured to at least partially house a portable electronic device such as a cell phone, music device, iPod, iPad, camera, PDA, tablet computing device, video game system, audio/video device, GPS unit, a laptop or other computer, or the like. The carrier may comprise a foldable structure or have various other configurations.

A variety of carriers are disclosed herein. For example, in one embodiment a carrier may comprise a foldable structure comprising a first panel and a second panel. The first panel and second panel may be rotatable between a closed position and one or more open positions relative to one another. An interior side of the first panel may be adjacent an interior side of the second panel when the foldable structure is in the closed position. The two panels may be formed from a rigid material.

An interior recess may be in at least one of the two panels configured to accept the portable electronic device therein. At least one charging port may be at the interior recess and electrically coupled to the solar panels. The at least one charging port may be configured to provide electricity to the portable electronic device. The at least one charging port may be positioned at a wall of the interior recess such that the at least one charging port is automatically coupled with a mating port of the portable electronic device as the portable electronic device is inserted into the interior recess.

The exterior side of the first panel and the exterior side of the second panel may define an exterior surface of the carrier. One or more solar panels may be mounted to the exterior surface. One or more retractable legs configured to extend and retract from the exterior surface may be mounted to the exterior surface.

At least one of the retractable legs may be mounted to the exterior surface at the proximal end of the second panel. Alternatively or in addition, at least one of the retractable legs may be mounted to the exterior surface at the distal end of the second panel. The retractable legs may be rotatably mounted to the exterior surface such that the retractable legs may rotate from a retracted position wherein the retractable legs are adjacent the exterior surface and to an extended position wherein the retractable legs extend outward from the exterior surface. It is noted that the retractable legs may each be mounted within a recess in the exterior surface.

In another exemplary embodiment, a portable electronic device carrier may comprise a first panel configured to cover a first side of the portable electronic device, and a second panel comprising a raised peripheral portion to form a recess for accepting a second side of the portable electronic device. One or more rotatable mounts may attach the first panel to the second panel such that the first panel and second panel are rotatable relative to one another via the rotatable mounts. One or more retractable legs may be mounted to an exterior side of the second panel, such as at a distal or proximal end of the second panel.

One or more solar panels mounted to an exterior side of the first panel. For example, an exterior side of the first panel may have a recess and wherein the solar panels are mounted within the recess.

At least one charging port may be at the recess and electrically coupled to the solar panels. The at least one charging port may be configured to provide electricity to the portable electronic device. At least one of one or more externally accessible data ports may be electrically coupled to the charging port to communicate data with the portable electronic device. It is noted that the externally accessible data ports may be various types of ports including one or more HDMI ports, USB ports, memory card readers, optical data ports, and electrical power ports.

Other electronic components may be included as well. For instance, a memory device configured to store data may be in electrical communication with at least one of the externally accessible data ports. In addition, a video and audio output device, such as an HDMI output device may be provided. The video and audio output device may accept input (typically a video signal) from the portable electronic device, and process the input to produce digital audio and video output. The output may be produced according to a standard, such as the HDMI format/standard. The video and audio output device may be connected to an output port, such as HDMI port. In this manner, the portable electronic device may output HDMI signals to an external device, such as a television, display, audio device, or the like.

Methods for supporting and powering a portable electronic device with a portable electronic device carrier are also disclosed herein. In one exemplary embodiment, such a method may comprise providing a foldable structure comprising a first panel and a second panel wherein the first panel and second panel are rotatable between a closed position and one or more open positions relative to one another. An interior side of the first panel may be adjacent an interior side of the second panel when in the closed position.

An interior recess configured to accept the portable electronic device may be formed in at least one of the two panels. At least one charging port may be provided at the interior recess. One or more solar panels may be mounted to an exterior surface of at least one of the two panels. The at least one charging port may be electrically coupled to the solar panels. A memory device may be mounted to at least one of the two panels. Data may be communicated with a memory device from the portable electronic device via the at least one charging port.

One or more retractable legs may be mounted to the exterior surface of at least one of the two panels. Similar to above, the retractable legs may extend and retract from the exterior surface.

The method may also comprise extending at least one of the retractable legs, and moving the at least one retractable leg such that both ends of the at least one retractable leg is in contact with at least one of the two panels. This contact allows the at least one retractable leg to hold the two panels in position relative to one another.

It is noted that moving the at least one retractable leg may comprise rotating the first panel relative to the second panel such that the first panel and the second panel are in a non-parallel angle relative to one another. Extending the at least one retractable leg may comprise extending a retractable leg at a proximal end or at a distal end of at least one of the two panels. Extending a retractable leg at the proximal end of at least one of the two panels may hold the two panels in a first open position, while extending a retractable leg at the distal end of at least one of the two panels may hold the two panels in a second open position that is distinct from the first open position. This allows the carrier to hold a portable electronic device in different positions, such as an upright position and a reclined position each of which may be well suited for particular tasks.

In yet another embodiment, a carrier comprises a case and a cover. The case is configured to at least partially contain a personal electronic device. The case may comprise, for example, a generally rigid body having a back and upwardly extending side walls which define an interior area having a generally open front. The personal electronic device may be located in the body so that the display of the device is viewable through the open front of the case.

Preferably, the case includes power and data links to an associated personal electronic device, and includes one or more docks for engagement with one or more external devices, and preferably a cover. The case may include a stand, such as one or more legs, which permit the personal electronic device to be supported in various use positions.

The cover is configured to accept a personal electronic device containing case. The cover may comprise a body with a back and an outwardly extending wall which generally defines an interior area. The interior area may be selectively closed with a flap.

The cover preferably includes at least one port for mating with the dock of an associated case. The cover may include an external device port which permits power from an external source to be routed through the port to the connector of the case and thereon to the personal electronic device for charging the device. The cover may also include one or more batteries, whereby a personal electronic device can be operated or charged via connection to the cover via the case.

Preferably a data link is also provided between the cover and the personal electronic device via the case. The cover may be connected to an external device, such as via a cable which is connected to the external port of the cover. The data may be routed from the cover through the case to the personal electronic device via the mated dock and port of the case and cover.

Further objects, features, and advantages of the present invention over the prior art will become apparent from the detailed description which follows, when considered with the attached figures.

BRIEF DESCRIPTION OF THE DRAWINGS

FIG. 12 is a front perspective view of a portable electronic device case of a carrier in accordance with another embodiment of the invention.

FIG. 13 illustrates how a portable electronic device is associated with the case illustrated in FIG. 12.

DETAILED DESCRIPTION OF THE INVENTION

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

One embodiment of the invention is a carrier for a portable electronic device, the carrier having a charging system. In one embodiment, the charging system comprises at least one battery. In another embodiment, the charging system comprises a solar or photovoltaic unit. In another embodiment, the charging system comprises at least one battery and a solar or photovoltaic unit.

As used herein, the term "portable electronic device" (or PED) may comprise any of a variety of devices now know or later developed which include their own limited power supply, such as a re-chargeable battery, which power supply must be re-charged from an external source. Such devices may comprise, but are not limited to cell phones, PDAs, portable music devices, iPods, iPads, GPS units, laptop and other computers, video game systems, video players, cameras and other devices.

One embodiment of the invention is a PED carrier. As disclosed herein, the PED carrier may have a variety of shapes, sizes and features, such as depending upon the one or more PEDs it is intended to be used with. In general, the carrier is preferably configured to house or contain at least a portion of a PED, such as for storage or transport.

Figure 1:
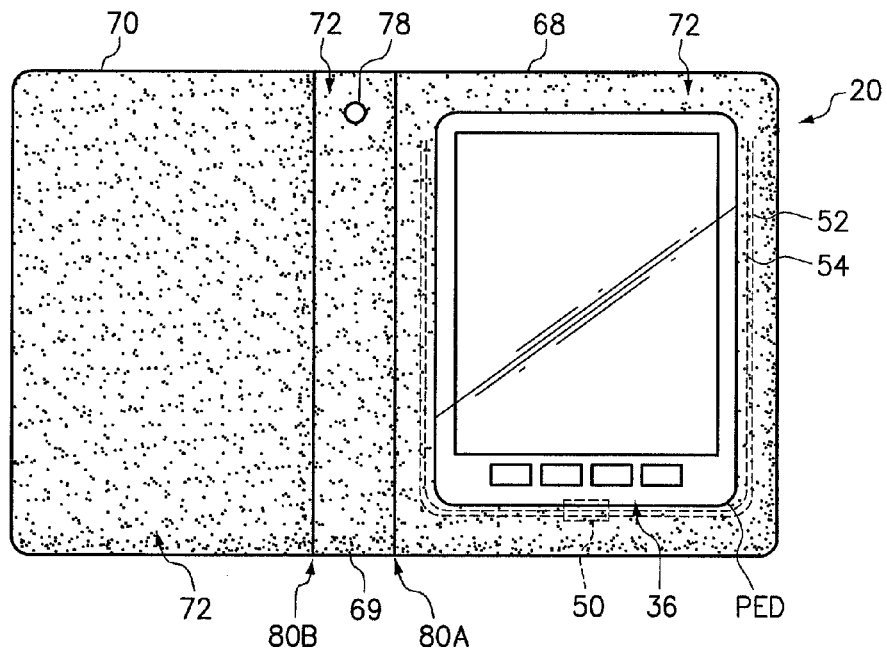
FIG. 1 illustrates one embodiment of a portable electronic device carrier of the invention in an open position.
Figure 2:
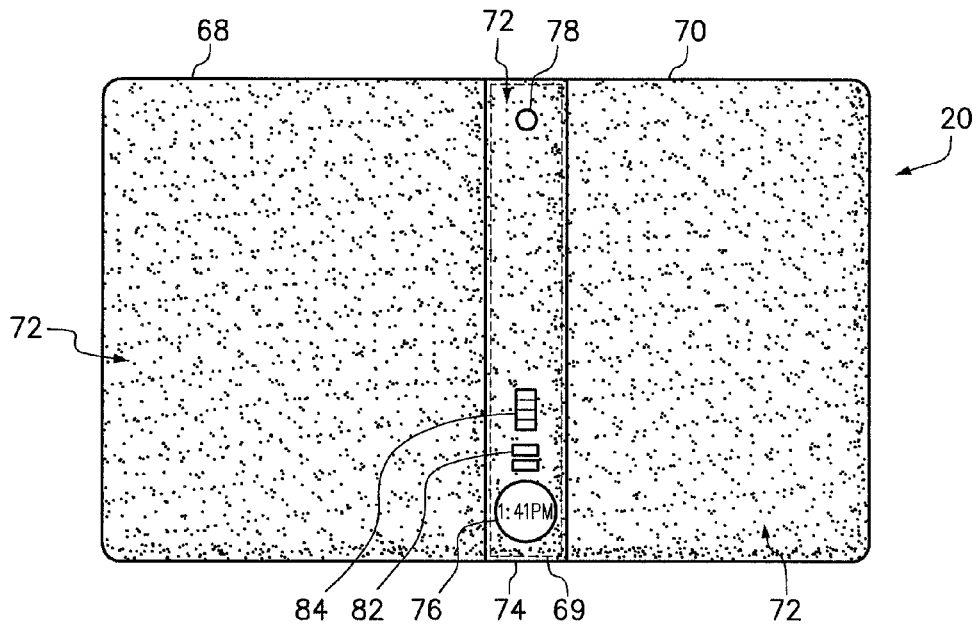
FIG. 2 is a rear view of the portable electronic device carrier of FIG. 1.

One embodiment of a carrier 20 is illustrated in FIGS. 1 and 2. This configuration carrier 20 is particularly adapted for accepting a generally planar PED. Referring to FIGS. 1 and 2, in some embodiments, the carrier 20 may be configured similar to a notebook, whereby the carrier 20 may have open and closed positions. In an "open" position, a PED may be accessible while in the carrier. For example, the carrier 20 may be configured to provide access to a screen, one or more input devices (e.g., buttons, touch screen, microphone, camera, etc.), or the like of a PED while the PED is within the carrier 20. This allows the carrier 20 to protect the PED and provide power (and other features) to the PED while permitting a user to access and use the PED. In a "closed" position, the carrier may generally protect or enclose the PED.

Figure 3:
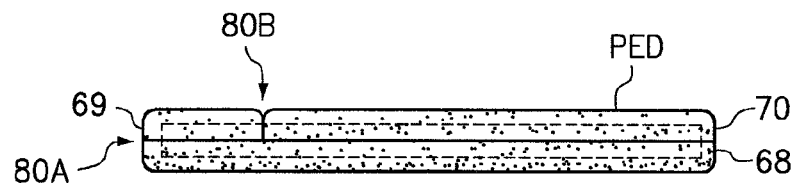
FIG. 3 is an end view of the portable electronic device carrier of FIG. 1 when in a closed position.
Figure 4:
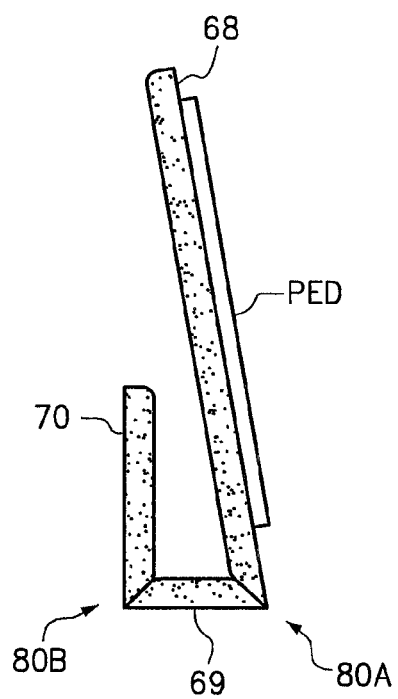
FIG. 4 is an end view of the portable electronic device carrier of FIG. 1 in a folded position.

As illustrated in FIGS. 1-2, the carrier 20 may comprise a foldable structure which may be manipulated to from a closed position in which it generally encloses the PED to an open position wherein the PED is accessible for use. For example, the carrier 20 may comprise a first, bottom or rear flap or panel 68 and a second, top or front or panel 70. Preferably, the carrier 20 may be folded about one or more articulation lines 80 or hinges/folds so as to move between the "open" and "closed" positions. To illustrate, as shown in FIG. 1, the carrier 20 has been opened to permit convenient access to the PED. FIG. 3 illustrates the carrier 20 folded at articulation line 80A to enclose the PED within the carrier. It is noted that there may be various open and closed configurations for the carrier 20. For instance, the carrier 20 may comprise multiple articulation lines 80 which allow for various open and closed positions or configurations of the carrier. FIG. 4 illustrates one such configuration where the carrier 20 has been opened by folding or bending the carrier's panels 68,70 at a first and second articulation line 80A,80B. Such a configuration may permit the carrier 20 to act as a stand, such as to support the PED in an upright and outwardly extending position for viewing (such as when the carrier 20 is resting upon a planar supporting surface).

As discussed above, the carrier 20, such as its panels 68,70 may comprise various materials. For example, the panels 68,70 might comprise a base or substrate material. Such a material might be rigid or flexible. In order to protect a PED therein, the panels 68,70 may comprise a padded material or include padding (such as padding located over a rigid substrate). In one embodiment, the panels 68,70 might have an outer protective material, such as a vinyl, leather or other surface. For example, the carrier 20 may comprise a cardboard of or plastic substrate, one or more resilient materials which cushion the PED and protect the PED from damage, and an outer protective vinyl layer. The articulation lines 80A,80B may comprise hinges or similar elements. For example, the articulation lines 80A,80B might comprise areas of flexible connecting materials between the panels 68,70 or portions thereof. In this regard, as detailed herein, there may be more than two panels or the panels may have multiple portions, the panels and/or portions thereof hinged or articulated in various manners.

In a preferred embodiment, the panels 68,70 are generally planar. However, in one or more embodiments, one or both panels 68,70 may have downwardly extending free edge portions. These edge portions may serve to enclose the edge portions of the carrier 20 in its closed position (when accounting for the thickness of a PED located between the panels 68,70).

Referring back to FIG. 1, the carrier 20 may comprise or define an interior area 36 which may be configured to accept a PED. In one embodiment, the panels 68,70 may be generally planar. In such a configuration, the carrier 20 may define an interior area when the panels are moved to a closed position. In such a configuration, a PED may be associated with a face of one of the panels, such as the rear panel 68, and then the front panel 70 may be folded over the rear panel 68 and the PED to enclose the PED.

In another embodiment, the carrier 20, such as one panel 68,70 thereof, may define a recessed area for a PED. For example, the rear panel 68 may define a depression configured to accept the PED and the top panel 70 may be configured to fold over and cover the PED. Preferably, the carrier 20 is configured to extend over and around the PED to house or contain the PED, such as by having the edge portion of the panels 68,70 extend outwardly beyond the PED, as best illustrated in FIG. 1. As indicated above, a depression or interior area may also be defined by one or both panels 68,70 having inwardly extending edge portions (to form a "clamshell" type enclosure). At the same time, when the carrier 20 is in its open position, the PED (such as a front face thereof) is preferably accessible to the user. In order to accommodate a PED therein, the two panels 68,70 may be connected by a spine portion 69 or one of the panel 68,70 may define such a portion in order to permit the two panels to be folded over one another (while accommodating the thickness of the PED).

In one embodiment, a PED may simply be placed on or inside the carrier 20. In another embodiment, the carrier 20 may include means for securing a PED thereto. For example, one or more threaded connectors (such as screws) may be used to couple the carrier 20 and mating threaded connectors on the back or other portion of a PED. The PED may be secured by one or more adhesives in some embodiments. In other embodiments, hook and loop fasteners, one or more straps, or the like may be used to secure the PED. The carrier 20 might also define a pocket having portions which grip or engage top, bottom and/or side portions of the PED. It is contemplated that a transparent cover may be positioned over the PED to secure the PED at the interior area 36 as well in one or more embodiments. The transparency of the cover allows a user to view the screen of the PED as well as various cameras, buttons, and other input devices while the PED is secured within the carrier 20.

One or more charging ports 50 may be associated with the carrier 20. As discussed above, the charging ports 50 may be configured such that a connection between a PED and a charging port 50 having one or more leads may be automatically made as the PED is placed into the interior area 36 of the carrier 20. For instance, a first and a second lead 52,54 (and additional leads) may be formed into the interior area 36. In FIG. 1 for example, a first and second lead 52,54 may be elongated and/or wrap around the interior area 36. These leads 52,54 may be exposed (and for example, comprise wires or planar strips) so that a charging interface of a PED may automatically contact the leads 52,54 when the PED is located in the carrier 20. In one or more embodiments, the PED may have an interface 56 connected thereto to permit this connection to be made (such as an interface member which plugs into a charging port of the PED and which extends outwardly there from and defines contacts for engaging the leads 52,54). As can be seen from FIG. 1, the first and second lead 52,54 allow a connection with an interface 56 at the bottom of the PED. Because the first and second leads 52,54 may be configured in various ways, the interface 56 may be at different locations on a PED and still connect to the charging port's leads.

It is noted that in some embodiments, the leads of a charging port 50 may correspond to a connector or interface 56 of a PED. In these embodiments, the leads need not be elongated or wrap around the interior area 36 as they may be configured for one or more particular PEDs. For example, the carrier 20 may define a plug or the like which is configured to be pressed into engagement with a charging portion of the PED.

As stated above, power may be supplied to a PED from various power sources. In some embodiments, the carrier 20 may comprise one or more solar cells, batteries, or both to provide power to a PED via the charging port 50. For example, one or more solar cells might be mounted to the exterior the panels 68,70 of the carrier. Such cells may have a variety of configurations now known or later developed. Preferably, however, such cells are configured convert light, such as solar energy, into electricity. In one embodiment, the carrier 20 may include a module or unit of two or more cells.

Preferably, the power source is associated with the carrier 20 so as to be transported therewith. In the embodiment where the power source comprises one or more photovoltaic cells, the cells are preferably associated with an exterior portion of the carrier 20, whereby the cells will be exposed to light.

In a preferred embodiment, a photovoltaic coating or ink is used to provide power from the sun or other light sources to the PED. For instance, as can be seen from FIG. 2, the back or other portion(s) of the carrier 20 may be coated with photovoltaic ink 72 to collect solar energy. The photovoltaic ink is highly beneficial in that it may be applied to some, a substantial portion, or all of the carrier's outer surface(s). In this manner, the surface areas of the carrier 20 which are capable of collecting solar energy may be maximized. For example, photovoltaic ink 72 may be applied to the front of the top panel 70 (so as, for example, to receive light when the carrier 20 is in its closed position and resting on a support surface), to be applied to the back of the bottom panel 68 (so as, for example, to receive light when the carrier 20 is in its closed position and resting on the top panel 70), or be applied to the inside surface of the top panel 70 and/or the front surface of the bottom panel 68 (so as, for example, to receive light when the carrier 20 is in its open position).

The photovoltaic ink 72 may be applied to the panels 68,70 or comprise a thin film material (i.e. have a supporting structure) which is connected thereto. For example, the photovoltaic ink 72 may comprise a thin layer material which is adhered onto the panels 68,72 or placed within covering sheets or the like of the panels 68,70. Such ink 72 or ink layers may be flexible in one or more embodiments to facilitate folding of the carrier 20 or the like without damaging the energy collector(s). Because the photovoltaic ink 72 may be flexible, even portions of the carrier 20 that bend, fold or flex may be coated covered.

Figure 5:
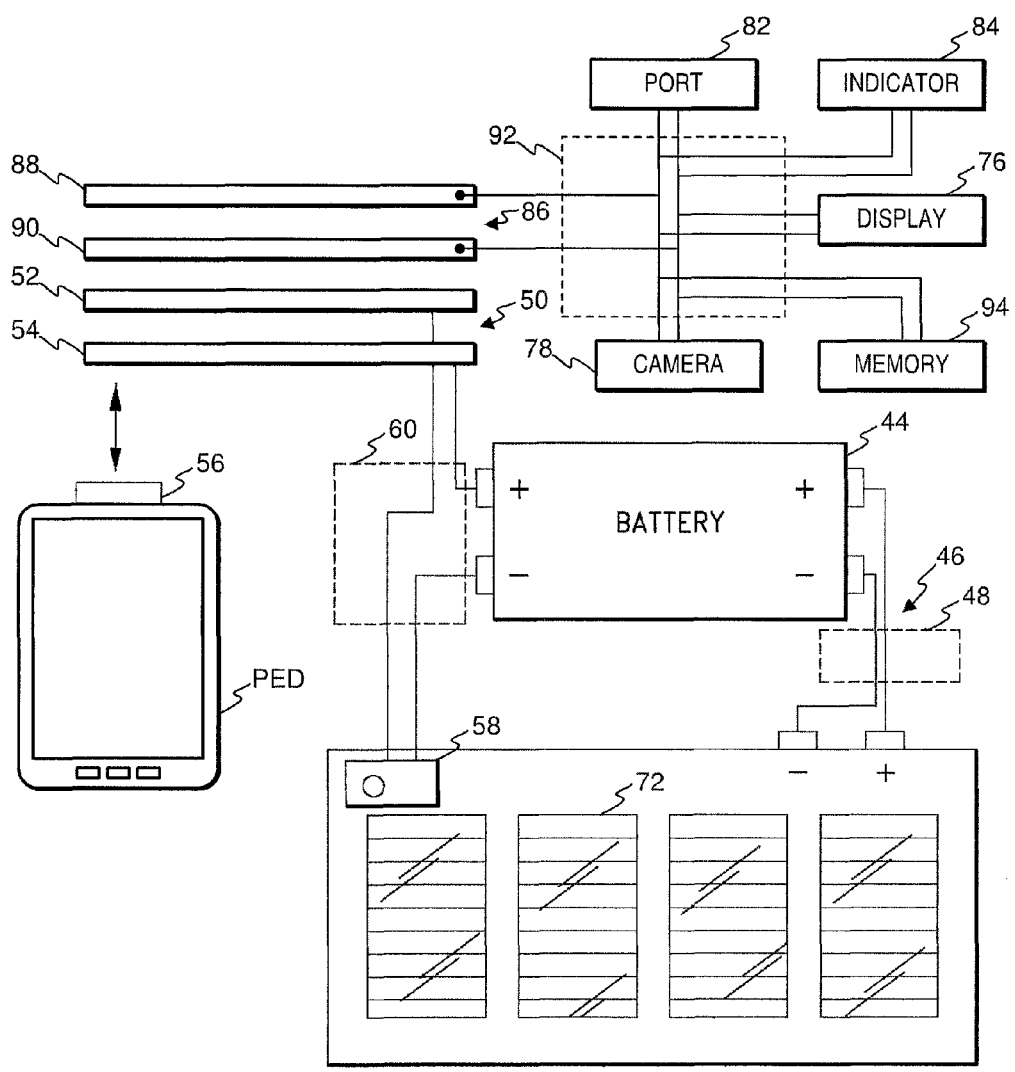
FIG. 5 schematically illustrates a charging system configuration and electronic peripheral system configuration in accordance with an embodiment of the invention.

Referring to FIG. 5, it is noted that a controller 48 may be used to regulate electricity generated by the photovoltaic ink 72 (or other energy collector), and a battery 44 may be used to store electricity and to deliver a steady flow of electricity to a PED such as described above.

In addition to power and charging features, the carrier 20 may also provide other features. Referring to FIGS. 1-2 and FIG. 5 for example, the carrier 20 may include various electronic accessories or peripherals which interface with the PED when the PED is held within the carrier. For example, the carrier 20 may comprise one or more cameras 78 (which camera(s) 78 may collect images and transmit them for storage or display by the PED), indicator lights 84 (to show the charging status of the PED), displays 76 (to display various information such as the charging level of the PED or the like), data/power connectors 82 (such as for connection to other devices, including other power sources), memory devices (such as for storing information such as image data collected by the camera(s) 78), speakers (such as to emit audio from the PED), microphones (to collect audio information for the PED), GPS receivers (to provide location information to the PED), accelerometers (to provide movement information to the PED), or various other sensors. In this manner, once within the carrier 20 a PED may have access to such accessories or peripherals.

FIG. 5 illustrates an exemplary configuration of the carrier's electronics including one or more electronic peripherals as well as the power supply/storage components described above. The peripherals may directly connect to a PED or may connect through one or more components. For example, one or more controllers 92 or the like may be used to facilitate connections between peripherals and a PED. As can be seen, in the embodiment of FIG. 5, one or more ports 82, indicators 96, displays 76, memory devices 94, cameras 78, or other peripherals may be connected via one or more controllers 92. It is noted that a controller 92, peripheral, or both may be powered by the carrier 20 or by the PED with a connection to the appropriate power source. In one embodiment, such devices may be mounted to or supported by the carrier 20.

In one or more embodiments, connections between one or more peripherals and a PED may occur through a docking port 86. The docking port 86 may comprise one or more leads 88,90 which allow a connection between a PED and one or more peripherals and/or a controller 92. The leads 88,90 may be configured to allow the docking port 86 to accept connections from a variety of PEDs. For example, the leads 88,90 may be elongated or wrap around a portion of the interior area 36 like the leads 52,54 of the charging port 50 shown in FIG. 1. An interface 56 may be used to form a connection between the PED and the docking port's leads 88,90 such as described above with regard to the leads of the charging port 50. In some embodiments, the docking port 86 may be configured for one or more particular PEDs. In these embodiments, it is contemplated that the leads 88,90 need not be elongated (or wrap around) as they may be specially configured to connect with a particular PED.

It is contemplated that the leads 52,54 of the charging port 50 and the leads 88,90 of the docking port 86 may be adjacent and that a single interface 56 (or other connector) may be used to connect with both the charging port 50 and the docking port 86. Of course, the docking port 86 and charging port 50 may be remote and have their own connectors/connections in one or more embodiments.

The peripherals may add a variety of functionality or enhancements to a PED. For example, a memory device 94 may increase the storage capacity of the PED. A camera 78 may give the PED the ability to record video and take pictures. One or more displays 76 or indicators 84 may be used to present information such as the time, date, temperature, one or more battery levels, solar energy collection levels, and the like. One or more ports 82 may be used to connect additional peripherals or other devices to the PED via the carrier 20 and allow communication with such peripherals or devices. For example, the PED may be connected to a personal computer via a port 82. As another example, the PED may be connected to external flash or other memory via a port 82. In addition, one or more ports 82 may be used to provide or accept power. For example, the PED may power a device or peripheral through a port 82. Alternatively or in addition, the PED may accept power through a port 82.

The one or more ports 82 may be a variety of standardized and/or proprietary connectors. For example, a port 82 may be a USB, Firewire (Trademark of Apple, Inc.), Ethernet, HDMI (Trademark of HDMI Licensing, LLC), VGA, flash media (e.g., SD (Trademark of Toshiba Corporation), Compact-Flash (Trademark of the Compact Flash Association), Memory Stick (Trademark of Sony Corporation)), or other connector. It will be understood that various audio/video or other data input/output ports 82 may be included with the carrier 20.

The peripherals and/or controller 92 may be stored at various locations of the carrier 20. For example, these components may be stored in one or more enclosures attached to or internal to the carrier 20. Referring to FIG. 2 for example, an enclosure 74 has been provided to house/support the components. An enclosure may be attached to an exterior surface of the carrier 20, such as one or more of the carrier's panels 68,70. Alternatively or in addition, an enclosure may be partially or fully embedded into a portion of the carrier 20, such as one or more of the panels 68,70. For example, as shown in FIGS. 3-4, it can be seen that the enclosure 74 may extend from the surface of the carrier 20 in one or more embodiments. Of course, the enclosure 74 may be flush with or beneath the surface of the carrier 20 in some embodiments. In these embodiments, it will be understood that the ports, displays, or other externally accessible parts may extend at least to the surface of the carrier 20 to be accessible/visible.

In some embodiments, at least a portion of the enclosure 74 may be externally accessible. This allows internal components to be maintained, replaced, or upgraded if desired. For example, a battery or memory device may be replaced with one that works or with one of higher capacity.

The "notebook" type configuration of the carrier 20 just described and illustrated in FIGS. 1-5 is particularly suited to supporting generally planar PEDs, such as tablet type PEDs. Such a PED might comprise an iPad device manufactured by Apple, though it might comprise other devices such as planar readers and even non-planar devices.

A particular benefit of the carrier 20 using energy collecting photovoltaic ink is that the profile of the carrier 20 may be limited. In this manner, the thickness of the carrier 20, including the panels 68,70 may be reduced or small in dimension, minimizing the profile of the carrier 20 including a PED, such as when it is in the closed position. As indicated above, use of such a photovoltaic ink also has the advantage that a larger surface area of the carrier may be used to collect energy than could be accomplished by attaching one or more standard silicon-based photovoltaic collection panels.

As with the prior embodiments of the invention, the carrier 20 as described may be configured so that when a PED is associated therewith, the PED is placed into charging position automatically (i.e. by mere location of the PED in the carrier 20, without having to connect wires or connectors manually in order to form a charging connection). Such may be accomplished by placing charging contacts of the PED (or an interface thereto) into communication with charging leads in the carrier 20.

It is noted that the carrier 20 may include additional convenience features in one or more embodiments. For example, one or more shoulder straps, handles, the like, or a combination thereof may be included to allow a user to carry the carrier. The straps or handles may be padded for comfort. The carrier 20 may also provide storage for various items. For example, storage compartments such as in the form of one or more pockets, straps, drawers, holsters, the like, or a combination thereof may be provided to hold PED accessories, such as a flexible Bluetooth or other keyboard, headphones, extra batteries, pointing devices, and power adapters. For example, a small drawer may be provided for headphones while a pocket may be provided for a keyboard. The pockets may be at various locations external or internal to the carrier 20. In addition, it is contemplated that the pockets may be on a shoulder strap or handle of the carrier 20.

FIGS. 6-10 also illustrate a carrier 120 having a foldable or multi-position structure. In this embodiment, the carrier 120 again has a front panel 170 and a rear panel 168. As indicated, the carrier 120 may preferably be placed or moved into different positions, such as by folding or bending at one or more hinges 96 to open and close, such as along the spine portion 169 of the carrier. For example, the front panel 170 and rear panel 168 may rotate relative to one another to allow the carrier 120 to open and close. As discussed above, when opened, the carrier 120 may provide access to a PED, and when closed may enclose the PED, such as to protect the PED.

Figure 6:
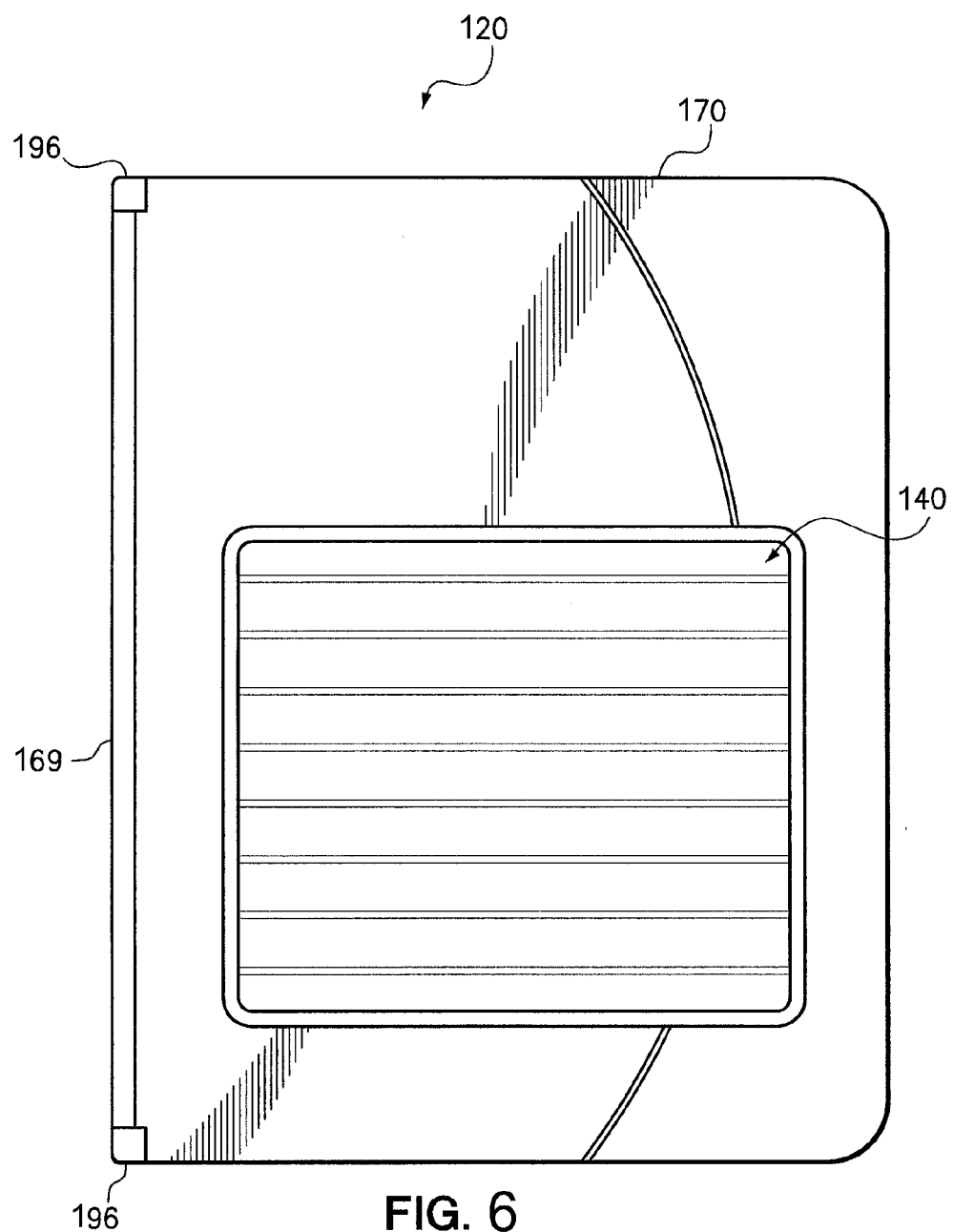
FIG. 6 is a front view of an exemplary portable electronic device carrier in accordance with another embodiment of the invention.

FIG. 6 is a front view of the carrier 120 showing the exterior side or portion of the front panel 170 (among other things). As can be seen, the carrier 120 may include one or more solar cells 140. As discussed above, the solar cells 140 may convert solar or light energy into electricity, such as to power the PED (or its accessories) or to charge the PED. The electricity may also be used to power various electronic components of the carrier 120. The solar cells 140 may be held by a portion of the front panel 170, such as shown. The solar cells 140 may be held in a recessed portion of the front panel 170. This moves the solar cells 140 away from the surface of the panel 170 thus reducing direct contact with the solar cells, which may damage or dirty the solar cells and reduce their efficiency. For instance, if placed front panel downward on a table or other surface, the recessed portion of the front panel 170 prevents the solar cells 140 from contacting the surface and from becoming scratched, damaged, or dirtied as a result.

As disclosed above, the carrier 120 may also or alternatively be coated with photovoltaic ink to produce electricity from light, and/or the carrier may include one or more batteries to provide electricity. This is highly advantageous in that it extends the battery life and thus the portability of the PED, sometimes greatly. For example, the battery life of a PED could be extended from hours to days, or more with the various power sources provided by the carrier 120.

The carrier 120 may be made from various materials. In one embodiment for example, the carrier may be made from plastic. Other materials, such as rubber, wood, metal, or other rigid or semi-rigid materials may be used. It is contemplated that the materials used may be selected for their ability to absorb shock to protect the PED. The materials may also be moisture proof or resistant to provide durability and long life and easy cleaning/maintenance. It is contemplated that one or more different materials may be used. For example, a rigid material may form the structure of the carrier 120, such as an outer shell, while a softer shock absorbing material forms an interior (or portions of the interior) of the carrier.

Figure 7:
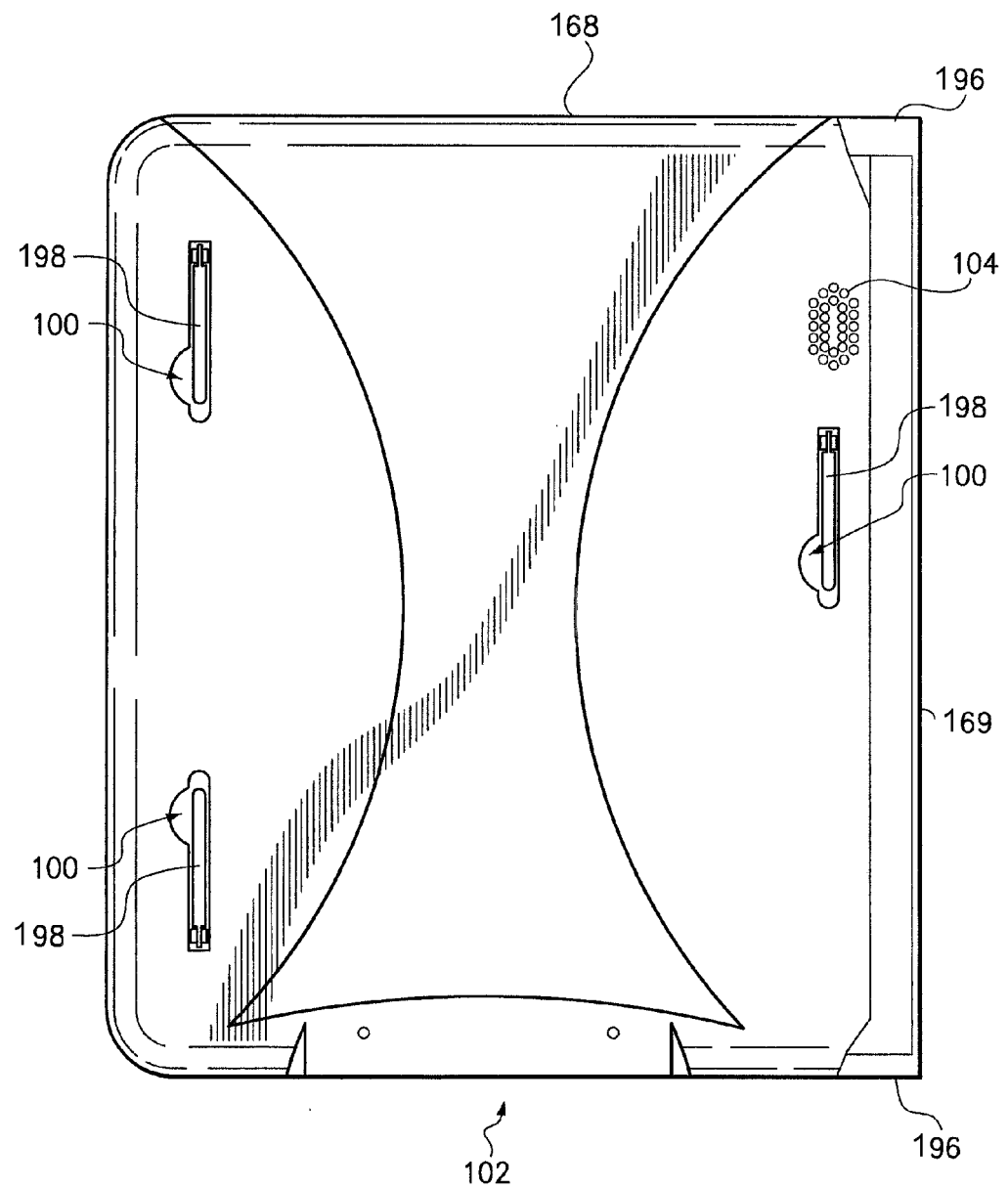
FIG. 7 is a rear view of the portable electronic device carrier of FIG. 6.

FIG. 7 provides a rear or back view of the carrier 120 showing an exterior side or portion of the rear panel 168 (among other things). It is noted that the exterior sides or portions of the front and rear panels may form an exterior surface of the carrier 120. As discussed above, a rear panel 168 may form the back portion of the carrier 120 in one or more embodiments. The rear panel 168 may also include additional elements. For example, as shown, the rear panel includes one or more port mounts 102 that may support one or more data or electrical ports. The rear panel 168 may also comprise a vent 104 to allow movement of air. The vent 104 may be used to allow sound and/or warm/hot air to escape the carrier 120.

In one embodiment, the carrier 120 includes means for retaining the carrier in one or more different positions. Such means might comprise one or more legs or supports. For example, the rear panel 168 could include one or more retractable legs 198 that may be extended to support the rear panel and which may be retracted when not needed. The retractable legs 198 may be held within one or more recesses 100 in the rear panel 168. This prevents the retractable legs 198 from interrupting the generally planar exterior surface of the rear panel 168, such as by protruding outward from the surface when the legs 198 are in their retracted position. As can be seen, the surface of the rear panel 168 may be planar or slightly angled/curved. The recesses 100 allow the retractable legs 198 to not interrupt the surface contours of the rear panel 168. It is noted that the recesses 100 may have an enlarged portion or other means to aid a use in gripping or otherwise moving the legs out of the recesses 100. For example, as shown, the recesses 100 include a semi-circular enlarged area that allows a user easy access to the retractable legs 198. In this manner, a user may easily extend the retractable legs 198 from their retracted position in the recesses 100. For example, a user may use his or her finger to extend one or more of the retractable legs 198.

The retractable legs 198 may have an elongated shape in one or more embodiments. For example, as shown, the retractable legs 198 are elongated cylinders. The legs 198 may have various shapes and lengths which allow the legs to extend outward from the surface of the rear panel 168. In one or more embodiments, the retractable legs 198 may be formed from a rigid material, such as metal, wood, plastic, or other rigid materials. In one embodiment, the retractable legs 198 may be stainless steel such as to withstand exposure to moisture from various sources that may be encountered as the carrier 120 and PED are used.

As can be seen, the retractable legs 198 have been arranged in a triangular pattern on the rear panel 168. Namely, two retractable legs 198 are at a distal side or end of the rear panel 168, while a third retractable leg 198 is at a proximal side or end of rear panel 168 adjacent the hinge 96 of the carrier 120. It is noted that the retractable legs 198 and recesses 100 could be at other locations. In addition, additional or fewer retractable legs 198 and recesses 100 may be provided in some embodiments. One or more retractable legs 198 could also or alternatively be mounted to the front panel in some embodiments. As disclosed below, the illustrated arrangement of legs 198 permits the rear panel 168 to be supported in at least two positions relative to the front panel 170.

Figure 8:
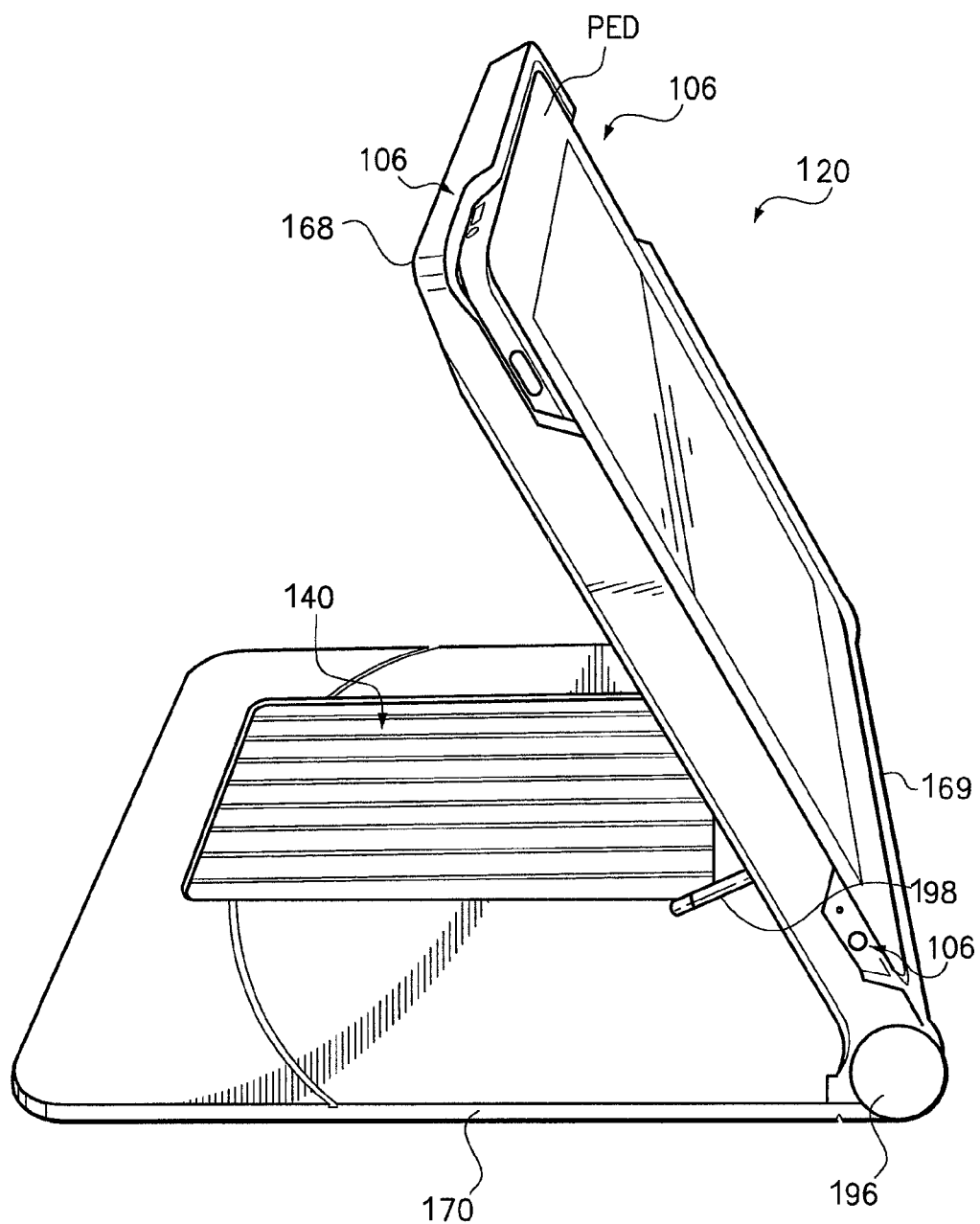
FIG. 8 is a perspective view of the portable electronic device carrier of FIG. 6 in a first open position.
Figure 9:
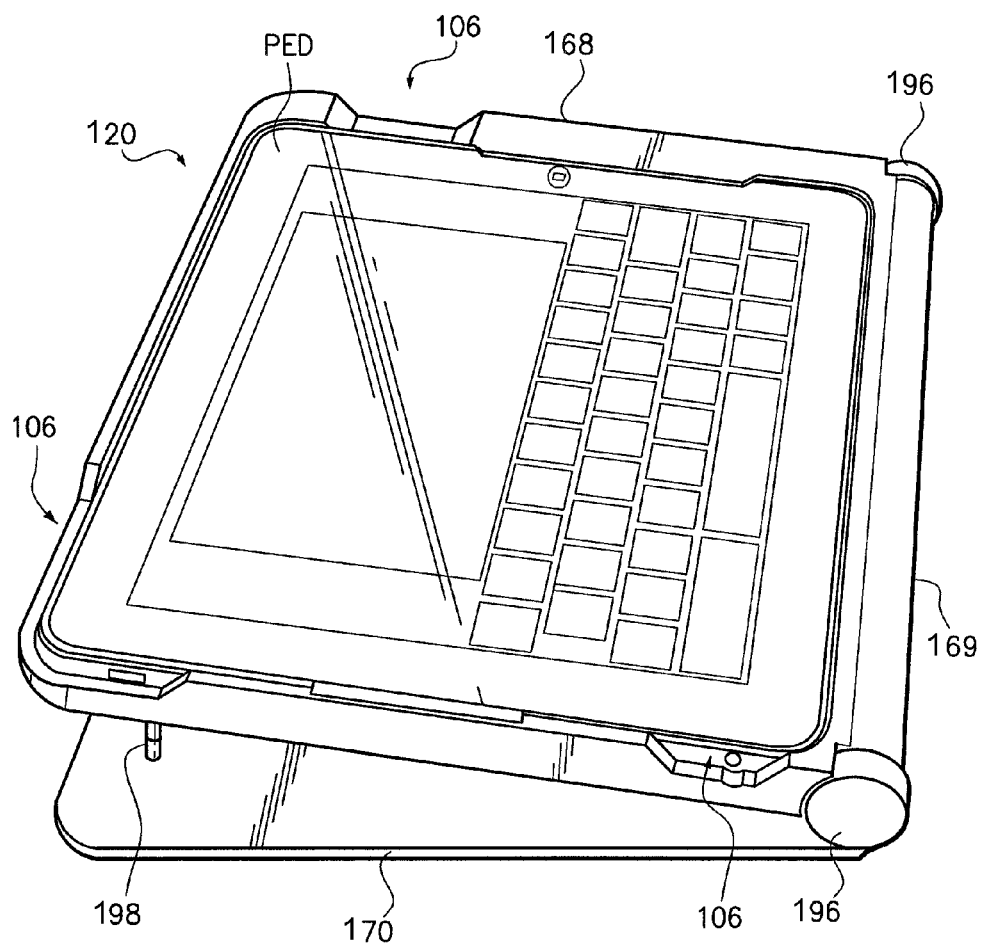
FIG. 9 is a perspective view of the portable electronic device carrier of FIG. 6 in a second open position.

FIGS. 6-7 illustrate the carrier 120 in a closed position where the interior sides or portions of the panels 168,170 are adjacent or are in contact with one another. In the closed position a PED may be enclosed by the panels such as to protect or store the PED therein. FIGS. 8-9 illustrate the carrier 120 in various opened positions. As can be seen from the open view of the carrier 120, the carrier may provide an interior area or depression where a PED may be secured or held within the carrier. For instance, FIGS. 8-9 show a rear panel 168 of the carrier 120 where the PED is held within a depression of the rear panel. Stated another way, the PED is held by the rear panel 168 and is bordered on its sides by portions of the rear panel 168 which extend to surround the PED. It is noted that this border may have one or more openings 106 to allow access to various ports, buttons, controls, inputs, outputs, or other features of the PED.

In FIG. 8, the carrier 120 has been opened to an upright position, like that illustrated in FIG. 4 and described above. As can be seen, a retractable leg 198 near the distal end of the rear panel 168 has been extended outward to support the rear panel in this upright position. In one embodiment, in the upright position, the rear panel 168 may be between 45 and 190 degrees relative to the front panel 170. As can be seen, the carrier 120 may be opened about its spine 169. It is contemplated that the carrier 120 may be opened to varying degrees from fully closed to fully open (e.g., 360 degrees where the front panel 170 and rear panel 168 contact one another). When fully open, the carrier 120 holds the PED like a pad or page, which is highly conducive to reading. As can also be seen, in the upright position, the solar cells 140 remain exposed to any light that may be nearby.

It is noted that the retractable legs 198 may extend and retract in various ways. For example, as shown in FIG. 7, the retractable legs 198 may be rotatably mounted to the rear panel 168. The retractable legs 198 may then be rotated outward to extend and rotated inward (toward the rear panel) to retract. It is contemplated that the retractable legs 198 could also telescope or otherwise extend outward from the rear panel 168, such that they extend beyond the surface of the rear panel.

The front panel 170 and rear panel 168 may be held in position relative to one another, such as in the upright position described above. This is advantageous in that it permits a user to use or work on his or her PED while the PED is positioned at a desired angle. As can be seen, a retractable leg 198 may be extended to hold the front panel 170 and rear panel 168 in position relative to one another. As can be seen from FIG. 8, the retractable leg 198 adjacent the proximal end of the rear panel 168 has been extended such that it contacts the front panel 170. This prevents the rear panel 168 from opening further, and thus holds the rear panel and PED in an upright position. To allow the rear panel 168 to open further, the retractable leg 198 may be retracted.

Typically, the distal end of the retractable leg 198 would not be secured or attached to the front panel 170. As can be seen for example, the retractable leg 198 may have a tip at its distal end that contacts the front panel 170. The tip may be rubberized or padded in some embodiments. It is contemplated that, in other embodiments, the front panel 170 may include a mount, fastener, or the like which removably secures the distal end of the retractable leg 198. This would prevent the rear panel 168 from inadvertently rotating forward or closed. Some exemplary mounts/fasteners include latches, clips, clamps, mating structures, magnets, and hooks. The tip of the retractable leg 198 may include a corresponding structure to attach to a mount/fastener of the front panel 170.

FIG. 9 illustrates the carrier 120 in another open position. As can be seen, the rear panel 168 is less upright in a reclined position, as shown. Typically, a reclined position will be at an angle less than 45 degrees, though various angles may be set. While the upright position of FIG. 8 may be desirable to some users for reading or presenting information from a PED, the reclined position may be desirable for interacting with the PED. For example, the reclined position may be more desirable for inputting text or interacting (e.g., dragging, tapping) with user interface elements.

A reclined position may be achieved in various ways. As shown for example, the retractable legs 198 at the distal end of the rear panel 168 may be extended to support or hold the rear panel at a lower angle than in the upright position. Since the retractable legs 198 at a distal end of the rear panel 168 are being extended, the distance that the rear panel 168 is separated from the front panel 170 is similar to or exactly the length of the retractable legs 198. In the upright position, a retractable leg 198 at the proximal end of the rear panel 168 may be extended. This causes the distal end of the rear panel 168 to be an increased distance away from the front panel 170 (as illustrated in FIG. 8). As disclosed above, the retractable legs 198 may only contact the front panel 170 or may be removably attached to the front panel when the carrier 120 is in the reclined position.

The retractable legs 198 may have various lengths to adjust the position at which they hold the front and rear panels. In one or more embodiments, the retractable legs 198 may all have the same or similar lengths. In such embodiments, the retractable legs 198 may be positioned at different locations to secure or hold the carrier's panels 168,170 at different open positions, such as the upright position and reclined position described above. Alternatively, the retractable legs 198 may have different lengths or a retractable leg may have an adjustable length to hold the panels 168,170 at different open positions.

Though not shown, it is contemplated that multiple retractable legs 198 could be extended. For example, both retractable legs 198 at the distal end of the rear panel 168 shown in FIG. 7 could be extended in the reclined position of FIG. 9. It is noted that the retractable legs 198 could also or alternatively be mounted to the front panel 170, such as in one or more recesses provided on the front panel. The retractable legs 198 may operate as described above if mounted to the front panel 170.

Other means may be provided for retaining the carrier 120 in multiple positions. For example, the front and rear panels 168,170 might be connected by one or more hinges that have lock to stop points. For example, such hinges might permit the rear panel 168 to be rotated to a first position (such as the upright position) and then stopped. A release movement or action may then be required to release the hinge to permit the rear panel 168 to be further rotated to one or more second positions (such as a reclined position), in similar manner. In another embodiment, the front and rear panels 168,170 might include a hinge having a main passage which may be aligned with multiple sub-passages, and where a pin may be moved in and out so as to lock the hinge in different positions of alignment between the main passage and sub-passages.

As can be seen from FIGS. 3-4 and 8-9, the carrier 120 may provide a form fitting covering for a PED. As described above, the carrier 120 may also connect to various data or electrical ports of the PED. For instance, the carrier 120 may have an integrated charging port, such as described above. The charging port may provide power to the PED, such as from an external power source connected to the carrier 120 or from the carrier's solar cells 140 or battery.

The carrier 120 may include other ports as well. For example, referring to FIG. 10, the carrier 120 may include one or more ports 182 for various data and other electrical connections. For instance, in the exemplary embodiment of FIG. 10, the carrier 120 has a port mounting structure 102 that may be used to mount one or more ports 182. As shown, the carrier 120 has a USB port 182A, micro USB port 182B, and an HDMI port 182C. A USB port 182 may be used to provide power to external devices or to accept power. It is noted that various data (including optical) or electrical ports may be provided. For example, a SD card or other memory card slot may be configured as a port 182 that accepts such memory cards.

These ports 182 may be connected to the PED such that connecting a device to these ports 182 connects the device to the PED as though it were connected directly to the PED. For example, the HDMI port 182C may allow video and/or audio to be communicated to or from the PED to an external device, such as a television. It is contemplated that the carrier 120 may include a circuit or processor in some embodiments that translates input/output from one or more of the ports 182 such that it is usable by the PED. Alternatively, at least one port 182 may not be connected to the PED. For example, the carrier 120 may have its own electronic systems that operate with or without the PED. In one embodiment, the carrier may function as a flash drive for instance. Connecting to a USB port 182A may allow access to the carrier 120 as a flash drive for storing or retrieving files.

Figure 11:
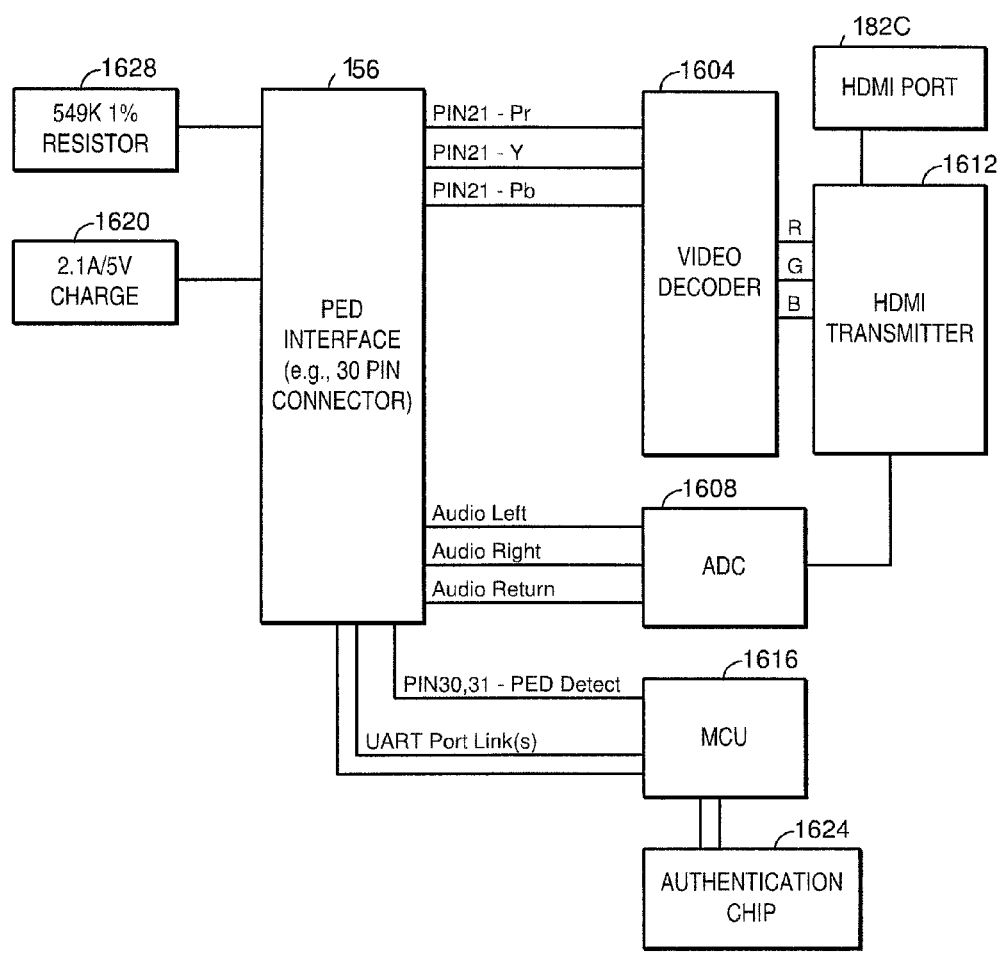
FIG. 11 is a block diagram illustrating an exemplary HDMI output device of a portable electronic device carrier.

In one or more embodiments, an HDMI port 182C may provide HDMI signals via an HDMI output device. FIG. 11 illustrates an exemplary HDMI output device. In general, the HDMI output device may accept an input, such as an audio and/or video signal. The HDMI output device may convert such input into digital audio and video signals that may be used with any HDMI capable device. In other words, the HDMI output device may generate output according to the HDMI standard/format. For example, HDMI output signals may be transmitted to televisions, displays, audio device, or other audio/visual equipment for viewing or listening. Though shown in an analog embodiment, it is contemplated that the HDMI output device may accept a variety of input signals, including analog and digital signals. It is noted that an HDMI output device may not be provided or necessary where a PED has its own HDMI output capabilities.

As can be seen from FIG. 11, the HDMI output device may connect to an interface 156 of a PED that provides audio and/or video output signals. In the embodiment shown, the PED provides YPrPb output as well as audio left and right channel output. Audio signals and video signals may be processed by separate components of the HDMI output device, such as shown. For instance, in the embodiment of FIG. 11, an analog digital converter (ADC) 1608 is provided to accept the analog audio signals from the PED and convert them to a digital signal for HDMI output.

It is contemplated that a video decoder 1604 may be provided to accept various video signals and process them to produce an output. Typically the processing by the video decoder 1604 will result in a signal output that may be understood and used by the HDMI transmitter 1612. For example, as can be seen, a video decoder 1604 may be provided to accept analog YPrPb signals from the PED. The video decoder 1604 may process this video signal and output RGB signals to the HDMI transmitter 1612.

Though shown as separate components (e.g., individual chips, processors, controllers, or the like), it is noted that the ADC 1608 and video decoder 1604 may be a single component, such as a single processor or controller in one or more embodiments. The single component may perform the audio and video processing in the same manner as the ADC 1608 and video decoder 1604 would individually. It is noted that other components of the HDMI output device could also be combined into various multi-function processors, chips, controllers, or the like.

As can be seen, the HDMI transmitter 1612 may accept audio and/or video input signals and produce HDMI output according to the HDMI standard. This permits the HDMI output to be used with any HDMI compatible device. In general, the HDMI transmitter 1612 may alter signal timings and voltages (among other things) to produce output according to the HDMI standard. The HDMI transmitter 1612 may also determine or set one or more characteristics of the audio and/or video being outputted. For example, the HDMI transmitter 1612 may communication video resolution, frame rate, audio resolution, audio sample rate, or the like to an external HDMI device (e.g., television, stereo, etc . . . ). The output of the HDMI transmitter 1612 may be sent via the HDMI port 182C, such as shown.

Though described above with regard to HDMI, it is noted that other video and audio signals could be generated, such as by providing a different transmitter 1612 or by instructing the transmitter 1612 to output signals according to other formats. This permits other analog or digital signals to be produced for use with external devices with various input capabilities.

It is noted that some PEDs may require confirmation, authorization, or other "handshaking" signal(s) before they will output video and/or audio signals. One or more components to provide such communication to allow audio/video output from a PED may be included. For example, an HDMI output device may include a microcontroller (MCU) 1616 configured to communicate with a PED. As can be seen, various links may be formed between the PED and MCU 1616 for such communications. For example, in FIG. 11, the MCU 1616 may communicate via one or more UART port links. In addition, the MCU 1616 may have one or more probe lines to detect various pin connections which may identify a particular PED from other PEDs.

In one or more embodiments, the MCU 1616 may identify the HDMI output device as a valid device for accepting video and/or audio output form the PED. In addition, the MCU 1616 may accept information from a PED, such as to determine what model or type of PED is connected to the MCU or HDMI output device. Operation of the HDMI output device may (or may not) be enabled or disabled based on the model or type of PED detected by the MCU 1616, in some embodiments.

In one or more embodiments, an authentication chip 1624 may be used to verify to the PED that an attached device or accessory, such as the HDMI output device, has been authorized/certified for use with the PED. The authentication chip 1624 may communicate with the PED via the PED's interface 156. For example, as shown, the authentication chip 1624 communicates authentication information with the PED through the MCU 1616. In operation, the MCU 1616 may facilitate communication between the PED and authentication chip 1624 to verify that the HDMI output device is certified or authorized for use with the PED (where the PED requires such certification or authorization). It is noted that, in some embodiments, the PED may not recognize or provide output to the HDMI output device without such certification or authorization.

In some embodiments, the HDMI output device may notify or inform the PED that it is present. For example, a signal or the like may be transmitted from the HDMI output device to the PED to inform the PED of the HDMI output devices presence. In one embodiment, a resistor 1628, such as the 549K 1% resistor shown, may be used. This resistor 1628 may identify the HDMI output device (or other accessory) to the PED. Upon detecting the value of the resistor 1628, the PED may then identify and subsequently use the HDMI output device. In some embodiments, if the PED does not receive a proper identification or notification signal, it may not be aware of or use the HDMI output device. It is contemplated that various resistors besides the 549K 1% resistor shown may be used.

Figure 10:
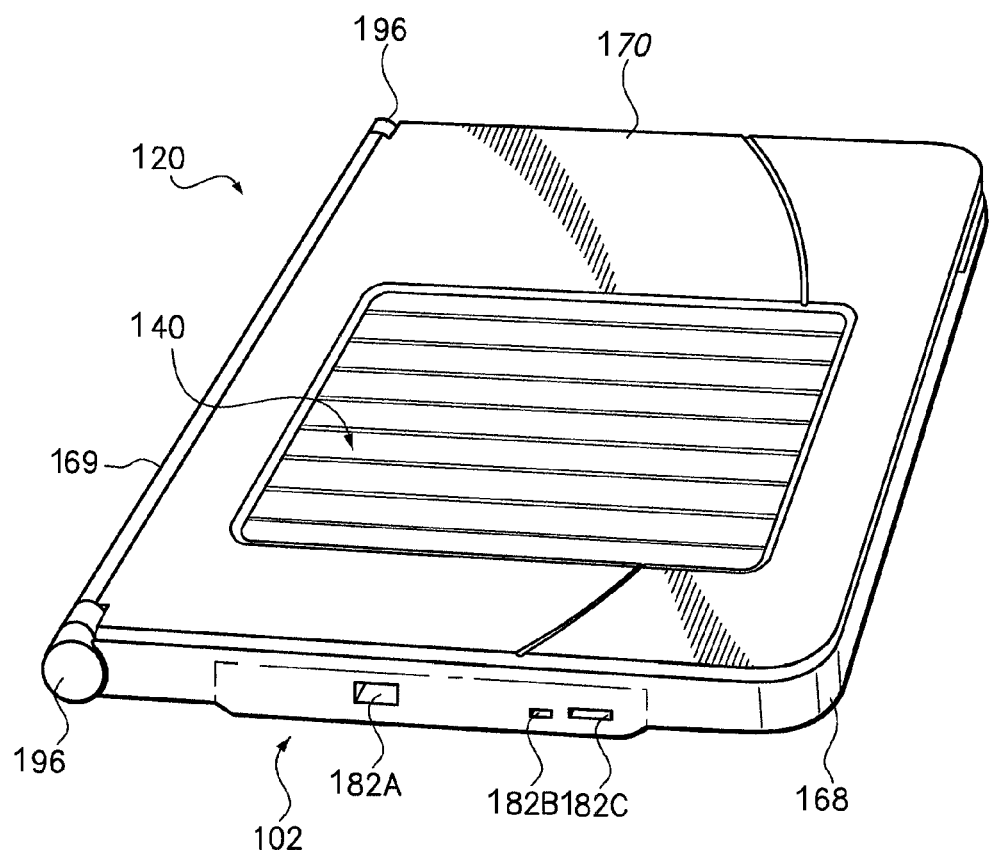
FIG. 10 is a front perspective view of the portable electronic device carrier of FIG. 6.

Referring to FIGS. 8-10, the HDMI output device, when provided, will typically be held within the carrier 120 in one or more embodiments. For example, the HDMI output device or components thereof may be in the front panel 170 and/or rear panel 168 of the carrier 120. Components or the entire HDMI output device may also or alternatively be within the spine of the carrier 120 in some embodiments. This is beneficial in that it allows the HDMI output device to be transported with the PED and carrier 120. This allows a user to have HDMI output capability (along with the other benefits of the carrier 20) wherever he or she is.

It is noted that one or more electrical leads or conduits/connections may couple the HDMI output device to an HDMI port 182C of the carrier 20 and/or to a battery, solar panel, or other power source of the carrier. For example, as shown in FIG. 11, electrical power may be provided to the PED and/or the HDMI output device by coupling the PED and/or HDMI output device to a power source 1620 (e.g., battery, solar panel, photovoltaic ink) at the PED's interface 156. It is contemplated that the HDMI output device may alternatively or also be powered by a separate connection to a power source 1620 or by the PED, such as a power output provided by a PED's interface 156.

Other video/audio input and output capabilities may be provided by a carrier 120 as well. For example, a DTV tuner may be provided to allow a PED to receive and present digital television to a user. The PED may also process, record, or otherwise manipulate DTV signals. A pico-projecter may also be provided in some embodiments, such as to allow video output from a PED to be presented in a large format, such as on a presentation wall, screen, or the like. This would be advantageous in displaying presentations to an audience, such as one or more slide presentations, videos, or the like. The DTV tuner and/or pico-projector may be held by or within the carrier 120, such as at or in a panel, spine, or both of the carrier.

The carrier 120 may include various other features. For example, a locator may be provided. The locator may help the user find the carrier 120. The locator may comprise a microphone and speaker along with accompanying circuitry in one or more embodiments. Upon detecting sounds of a certain type, pitch, tone, and/or length, the locator may respond by producing audible sounds through its speaker. For example, the locator may be configured to detect a whistle sound and respond by producing a beep or other sound that allows a user to locate the carrier 120.

It is contemplated that the carrier 120 may also provide wireless communications capabilities. For example, near field communications (NFC) capabilities may be provided by one of more NFC transmitters and/or receivers held within or by the carrier 120. Such transmitters and receivers may be coupled with the PED via an interface, such as described above. NFC capabilities would be beneficial in allowing the PED to communicate various data with nearby electronic devices.

The carrier 120 may have various colors and textures. For example, it is contemplated that the carrier 120 may have a 2-tone color in one or more embodiments to match that of sports teams, schools, or the like. One of the two colors may be produced by photovoltaic ink in some embodiments. The carrier 120 may also have a carrying case having an opening or transparent/translucent area(s) to allow light to reach the carrier so that the carrier may produce electricity. The carrying case may include one or more pockets, handles, straps, or the like to make the carrier 120 more easy to carry, even when a user's hands are occupied with other tasks.

In accordance with the invention, the carrier 120 may advantageously be used to protect the PED, permit the PED to be moved into different positions for use, charge or power the PED, and permit connection of various other devices with the PED. In one embodiment, for example, the carrier 120 including the solar charger may extend the usable time of the PED from around 10 hours to 9.5 days on average (based upon average use and lighting conditions which permit the PED to be charged by the carrier 120).

Figure 17:
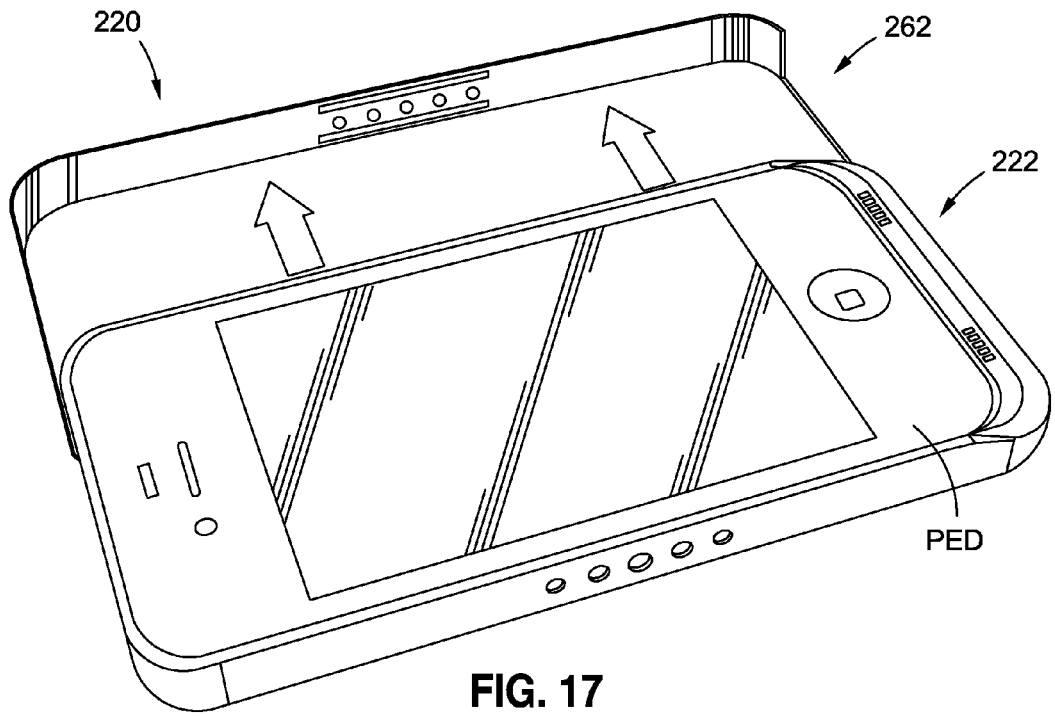
FIG. 17 illustrates a portable electronic device containing case being associated with the cover illustrated in FIG. 15.
Figure 18:
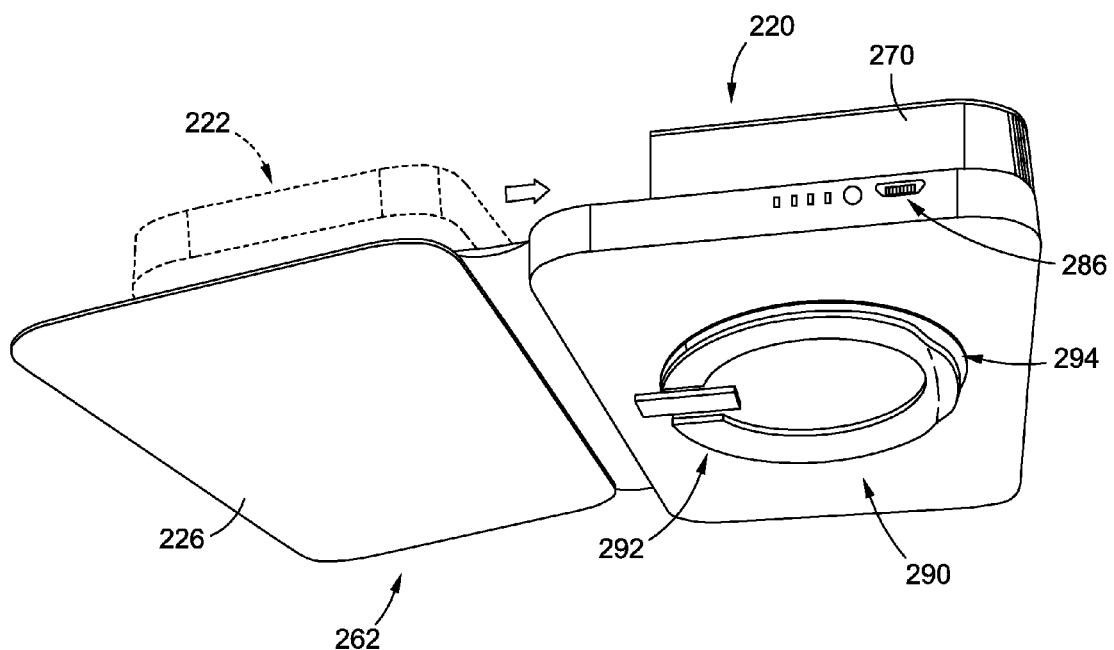
FIG. 18 is a bottom perspective of the cover illustrated in FIG. 15.

Another embodiment of a carrier in accordance with the invention will be described with reference to FIGS. 12-18. Referring to FIG. 18, this embodiment carrier 220 comprises a case 222 and a pouch or cover 262. In a preferred embodiment, the case 222 is configured to house a PED, and the pouch or cover 262 is configured to house a case 222 which has a PED associated therewith.

FIG. 12 illustrates one embodiment of the case 222. The case has particular utility to a PED which comprises an Apple® iPhone® mobile communication device, though the case 222 has utility to other devices, including the Samsung® Galaxy® mobile communication device, the Motorola® Droid® mobile communication device and others.

As illustrated, the case 222 comprises a body 224 which has a back 226, an upwardly extending peripheral or side wall 228 and a front 230. In one embodiment, the body 224 is generally rigid, such as constructed from a durable plastic material. The back 226 has a top surface 232 which is generally planar. In one embodiment, the back 226 is generally rectangular in shape. The peripheral wall 228 extends outwardly from the top surface 232 of the back 226 and cooperates with the back to generally define an interior area in which a PED may be located.

In this regard, the back 232 is preferably sized to conform to a PED. Likewise, the peripheral wall 228 has a height which is approximately the same as the depth of a PED which is to be associated therewith.

In a preferred embodiment the peripheral wall 228 extends around the entire perimeter of the back 226. However, in other embodiments the case 222 might only include top, bottom and side walls (which may not be connected) or a plurality of spaced apart walls, etc.

In one embodiment, a substantial portion of the front 230 of the case 222 is open. In a preferred embodiment, a lower portion of the front 230 defines a face 234. The face 234 is spaced from the back 226 and extends inwardly from the peripheral wall 228, preferably from a bottom portion of the case 222 towards the top thereof by some distance.

The case 222 may include a number of features. For example, referring to both FIGS. 12 and 14, when the case 222 is configured to accept an Apple® iPhone®, a first aperture 236 may be located in the back 226 of the body 224. This aperture 236 may be located and sized to permit viewing of the Apple® logo 237 which is located on the back of an Apple® iPhone®.

The case 222 may also include a second aperture 238 in a top portion of the peripheral wall 228 for alignment with a PED headphone port/jack, a third aperture 240 in the top portion of the peripheral wall 228 for alignment with a PED on/off switch, and a fourth aperture 242 in the back 226 for alignment with a PED camera. Of course, the shape, size and location of these apertures is preferably chosen to match those of the associated PED. In this regard, the case 222 might have other numbers of apertures and apertures of other sizes and locations than as specifically illustrated.

In one embodiment, one or more speaker apertures 244 and one or more microphone apertures 246 are preferably provided in the face 234. These apertures 244,246 correspond to the microphone and speaker of an associated PED. In one embodiment, a plurality of small apertures 244,246 is provided to limit the exposure of foreign material and the like with the speaker and microphone of the associated PED.

Most importantly, the case 222 includes a data and power link. The purpose of the link is to facilitate power and data connection between a PED and an external device, via the case 222. In one embodiment, the link includes a data and power connector 248 which extends from a bottom portion of the body 224 of the case 222 into the interior thereof. The connector 248 preferably defines one or more data or power connections. For example, in one embodiment the connector 248 may comprise a 30 pin power and data connector. The size, shape and location of the connector 248 correspond to mating connector of a PED which is to be associated with the case 222.

The case 222 also includes at least one external device dock 249. In a preferred embodiment, the dock 249 comprises one or more external device contacts and one or more connectors.

Still referring to FIG. 12, first and second connectors 250a,b are located in or on a side portion of the peripheral wall 228 at the interior of the case 222. The first and second connectors 250a,b may comprise metal strips which are configured to interact with one or more magnets (associated with an external device). In one embodiment, the first and second connectors 250a,b are spaced apart from one another, such as vertically on the peripheral wall 228.

The external device contacts preferably comprise a set of five external contacts. In one embodiment, two positive contacts 252, two negative contacts 254 and a single data contact 256 is provided. In one embodiment, the external contacts comprise generally circular conductive elements which positioned in a row or line, such as in the order (+), (−), (D), (−), (+) (where + is a positive contact 252, − is a negative contact 254 and D represents a data contact 256).

In one embodiment, a dock 249 is located at each side of the case 222. However, there could be only a single dock 249 or the case 222 could include more than two docks. As disclosed below, the configuration of each dock 249 and the location of the each dock is preferably configured to correspond to a pouch or cover 262 (and thus may vary depending upon the configuration of such a pouch or cover).

Importantly, the one or more docks 249 communicate with the connector 248. In one embodiment, a thin or flat printed circuit board (FPCB) 258 connects the dock 249 and the connector 248. The FPCB 258 may be located within the back 226 of the case 222, such as between two layers comprising the back 226. The FPCB 258 may have various functions, including being configured to perform processing or the like. In one embodiment, the FPCB 258 is configured to route or connect the one or more pins of the connector 248 to the external contacts 252-256. Of course, the configuration of the FPCB 258 may vary depending upon the particular PED and/or connector 248. In the illustrated embodiment, the FPCB 258 is configured to implement power/charging and data transfer functionality between the docks 249 and the connector 248.

Figure 14:
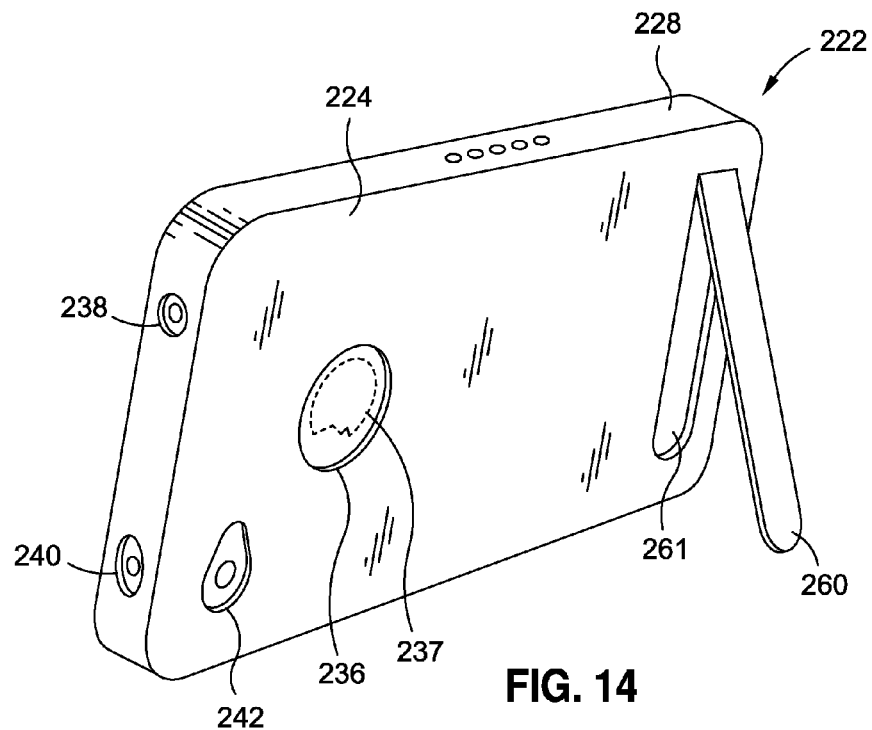
FIG. 14 is a rear view of the case illustrated in FIG. 12 with a portable electronic device associated therewith.

Use of the case 222 is illustrated in FIGS. 13 and 14. As illustrated in FIG. 13, a PED may be associated with the case 222. Preferably, a user inserts a bottom or lower end of a PED into the interior area of the case 222 and slides the bottom end of the PED downwardly. As the PED moves downwardly, the connector 248 preferably moves into engagement with the associated port of the PED. In addition, the bottom or lower end of the PED preferably slips under the face 234 of the front 230 of the case 222. As illustrated in FIG. 13, the user may then move the remainder of the PED downwardly into the interior of the case 222 until the PED rests upon the back 226 of the case 222.

Preferably, the case 222 is configured to tightly engage the PED so that the PED is secured to the case 222, though removable there from without the aid of tools.

As illustrated in FIG. 14, when the PED is associated with the case 222, various features of the PED are preferably accessible. In particular, a headphone jack may be accessed through the associated second aperture 238 in the case, an on/off switch may be access through the associated third aperture 240, and a camera lens aligns with the third aperture 242. As illustrated, the PED logo 237 may be aligned with the main, first aperture 236. In addition, the PED is preferably inserted into the case 222 face-up, whereby the one or more displays (and associated touch-screens) are accessible/viewable through the generally open front 230 of the case 222.

The case 222 provides protection to the PED, such as in the event the PED is dropped. In addition, the case 222 provides a convenient support for the PED. As illustrated in FIG. 13, the case 222 may include at least one leg or stand 260. In one embodiment, the leg 260 is movably connected to the case 222 and is configured to be moved between a retracted position in which it fits within a recess 261 in the back 226 of the case, and an extended position it which it extends outwardly thereof, as best illustrated in FIG. 14. In one embodiment, the leg 260 may be generally planar and have a first end which is connected to the case 222 and a second end which may be extended outwardly there from. The leg 260 may be movably connected to the case 222 in various manners, including by a flexible material, hinge, pin or the like.

As illustrated in FIG. 14, when the leg 260 is extended, the PED and case 222 may be supported in a landscape orientation. However, the PED and case 222 may be rotated 190 degrees (clockwise in the illustration) and be supported in a portrait position. On the other hand, the leg 260 can preferably be retracted to a closed position in the recess 261. At that time, the case 222 preferably has a generally planar or flat back surface and can be laid flat onto a supporting surface.

As indicated, in this embodiment of the invention, the carrier 220 includes a pouch or cover 262. While a PED may be used with the case 222 alone, the PED with case 222 can preferably also be associated with the cover 262, as best illustrated in FIG. 18.

Figure 15:
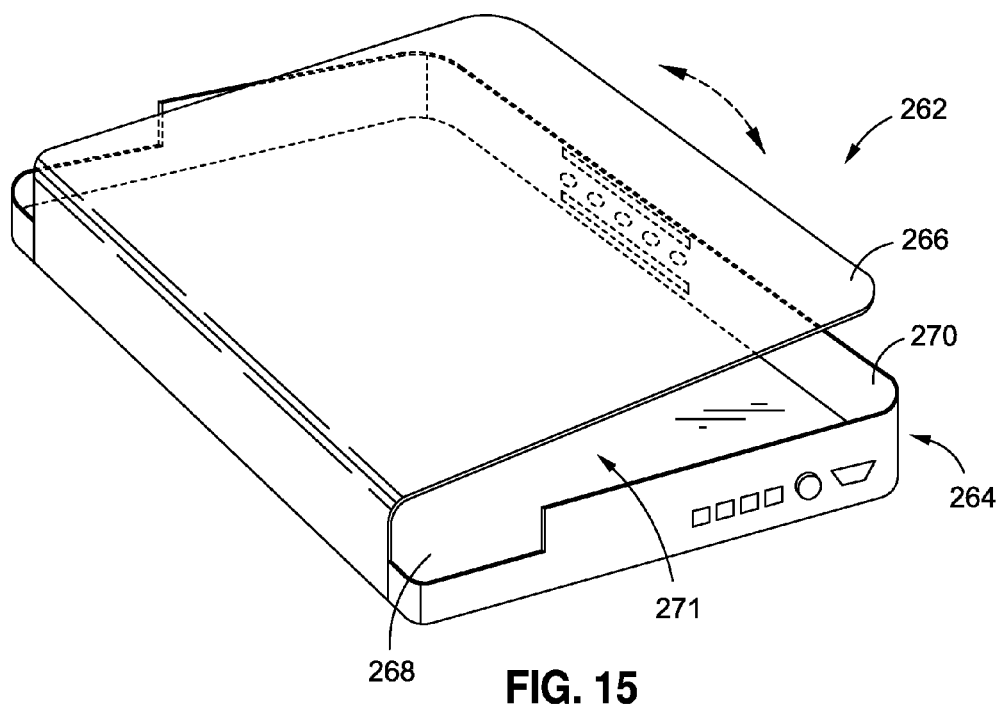
FIG. 15 is a front perspective view of a portable electronic device cover of a carrier which is configured to accept the case illustrated in FIG. 12.

Referring to FIGS. 15, in one embodiment the cover 262 comprises a body 264 having a flap 266. In one embodiment, the body 264 is similar to the body 224 of the case 222. In particular, the body 264 has a back 268 and an upwardly extending peripheral or side wall 270. The wall 270 preferably extends outwardly from a top surface of the back 268 around a portion of a periphery thereof.

Preferably, the body 264 of the cover 262 defines an interior area 271 which is configured to accept therein a case 222. As such, when the case 222 is generally rectangular as illustrated in FIG. 12, the body 264 has a similar shape.

Generally, the body 264 has an open front or top. Preferably, however, the flap 266 is attached to the body 264, such as along one side thereof, and is configured to move to a closed position in which it extends over and generally closes the front or top of the body 264, as illustrated in FIG. 15. The flap 266 may be connected to the body 264 in various manners, including via a generally flexible spine which permits the flap 266 to be rotated back and forth. In other embodiments the flap 266 might mounted via one or more pins, hinges or the like which permit movement of the flap. The flap 266 preferably has a shape similar to the back 268, whereby the flap 266 has a peripheral edge which corresponds to the wall 270 (when the flap 266 is closed).

Figure 16:
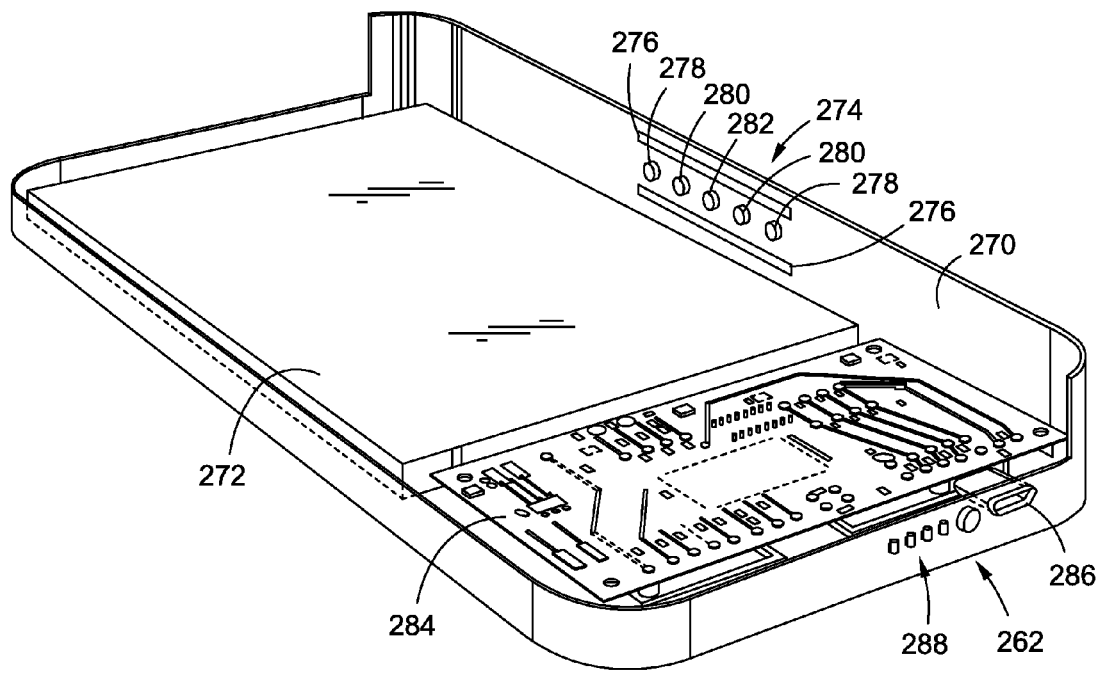
FIG. 16 is a cut-away view of the cover illustrated in FIG. 15.

FIG. 16 illustrates the cover 262 in a cut-away view (including without the flap 266). In one embodiment, the cover 262 includes at least one power source. As described above, such a power source might comprise one or more solar panels, photovoltaic ink or other elements. However, in a preferred embodiment, the power source comprises at least one battery 272. Preferably, the battery 272 is generally planar and comprises a rechargeable battery. Of course, the one or more batteries 272 may be of various types including NiCad, Lithium-polymer, etc.

The power source is configured to provide power to a PED via at least one port 274. The port 274 preferably comprises one or more connectors and one or more contacts. Preferably, the port 274 is designed to engage or mate with a dock 249 of the case 222. Thus, in a preferred embodiment, the port 274 includes two magnets 276. The magnets 276 are located in or one the peripheral wall 270 of the cover 262. The magnets 276 are preferably positioned in a location of the cover 262 where they are in close proximity to the connectors 250a,b of the dock 249 of an associated case 222. Thus, as illustrated, the magnets 276 are, like the connectors 250a,b of the case 222, spaced apart from one another and located in the side of the wall 270 (such as generally opposite the side of the cover 262 at which the flap 266 is connected).

In addition, the port 274 includes one or more contacts for mating engagement with the contacts 252-256 of an associated case 222. The contacts preferably comprise a set of five contacts. In one embodiment, two positive contacts 278, two negative contacts 280 and a single data contact 282 is provided. In one embodiment, the external contacts comprise generally circular conductive elements which positioned in a row or line, such as in the order (+), (−), (D), (−), (+) (where + is a positive contact 278, − is a negative contact 280 and D represents a data contact 282).

The contacts 278-282 are preferably associated with the peripheral wall 270 of the cover 262 and positioned to contact or mate with the contacts 252-256 of a case 222. Thus, in a preferred embodiment, the contacts 278-282 extend into the interior area 271 from an inner surface of the peripheral wall 270.

In one embodiment, the cover 262 includes a printed circuit board or similar controller 284 and one or more external device ports 286. The one or more external device ports 286 may be configured to exchange data with one or more external devices and/or provide power to the battery 272.

For example, the external device port 286 may comprise a micro-USB port which provides both power and data connections. The external device port 286 may be linked through the controller 284 to the battery 272. In this manner, power from an external source (such as a wall plug) may be routed through to the port 286 (such as via a cable) and thereon through the controller 284 to the battery 272 for charging the battery.

In addition, data may be exchanged with the cover 262 via the port 286. In particular, data may be transmitted to or transmitted from the controller 284 via the port 286.

Of course, as indicated, it is possible for the cover 262 to have more than one port 286, such as one or more power ports and one or more data ports.

Preferably, the controller 284 is communicatively coupled to the at least one data contact 280. As described below, data from a PED may be routed through a data contact 256 of the case 222 to the data contact 280 of the cover 262 to the controller 284 (and thereon be exchanged with an external device as described above, via the external device port 286).

Preferably, the battery 272 is coupled to the power contacts 278,280 of the port 274 of the cover 262. In this manner, power from the battery 272 may be provided to a PED through the contacts 278,280 of the cover 262 coupled to the contacts 252,254 of the case 222. Alternatively, power from an external source may be provided to the cover 262 (such as through the external device port 286) and thereon through the power contacts 278,280 to the case 222 and associated PED.

In one embodiment, the battery 272 and controller 284 are housed in the back 268 of the cover 262. In particular, the back 268 may define or more chambers or a generally enclosed interior area in which such components may be housed.

The cover 262 may include other features. For example, the cover 262 may include one or more lights or other indicators 288. These lights 288 might, for example, illuminate or illuminate in different colors to indicate a charging status of the battery 272, that data is being exchanged with an external device, or other conditions.

Referring to FIG. 18, a mount 290 may be associated with the cover 262. In one embodiment, the mount 290 is connected to a bottom of the back 268 of the cover 262 (so that it is externally accessible). The mount 290 may be detachable from the cover 262, such as by using one or more fasteners (such as tabs on the mount 290 which may be moved in and out of engagement with mating slots in the cover 262).

As illustrated, the mount 290 may comprise a generally circular body which has a top 292 and a bottom 294. The mount 290 may be connected to the cover 262 at the top 292 and the bottom 294 may be configured to be moved away from the cover 262. In this manner, a user may pass a support element, such as a belt, belt loop or the like, into the space between the mount 290 and the cover 262. In this manner, the user may mount the cover 262 to a support, such as their belt.

Use of the cover 262 will be described first with reference to FIG. 17. In a preferred embodiment, a PED which is associated with a case 222 may be associated with the cover 262. Preferably, the PED-containing case 222 may be slid into the interior space 271 of the cover 262 when the flap 262 (not shown in FIG. 17 for convenience) is open.

When the case 222 is slid into the cover 262, at least one of the docks 249 of the case 222 engage at least one of the ports 274 of the cover 262. In particular, the positive contacts 252 on the case 222 engage the positive contacts 278 of the cover 262. The negative contacts 254 on the case 222 engage the negative contacts 280 on the cover 262. Lastly, the data contact 256 on the case 222 engages the data contact 282 on the cover 262.

Because the PED is in communication with the power and data contacts 252-256 of the case 222 via the connector 248 of the case 222, the connection of the case 222 to the cover 262 as just described thus places the PED in communication with the cover 262.

First, so engaged, power from the battery 272 of the cover 262 may flow through the connected dock and port thereon to the PED, thus powering the PED and/or recharging the battery thereof. Second, data may be exchanged with the PED and one or more external devices via a connection of such an external device with the one or more external device ports 286 of the cover 262.

For example, a user might place the PED containing case 222 into a cover 262 to transport the PED or for storage. As indicated, the PED containing case 222 may be located in the cover 262 and then the flap 266 may be closed, thus protecting the PED. In addition, the cover 262 may be connected to a user's belt or other supporting article, thus making it easy to transport the PED.

Further, a user may place the PED containing case 222 into a cover 262 in order to power the PED and/or recharge the battery thereof, or to exchange data with one or more external devices.

In addition, the user might remove the PED containing case 222 in order to use the PED separate from the cover 262, such as in the manner described above and illustrated in FIG. 12.

Of course, this embodiment carrier 220, including the case 222 and cover 262, may have other configurations. For example, the number of power and data contacts of the dock (s) 259 of the case 222 and of the port(s) 274 of the cover 262 may vary. For example, there might be a single set of mating positive and negative contacts, more than one mating set of data contacts or the like.

In one embodiment, the connectors 250a,b on the case 222 and the magnets 276 associated with the cover 262 are configured to engage one another to aid in maintaining the case 222 in position with the cover 262 (thus aligning the respective power and data contacts thereof and maintaining them in contact with one another). Of course, means for connecting the case 222 and cover 262 might vary. For example, the case 222 might be provided with only a single connector or more than two connectors and the cover 262 might be provided with only a single magnet or more than one magnet. In another embodiment, the magnets might be provided on the case 222 and the contacts might be provided on the cover 262. Of course, other means for connecting might be used, such as mating tabs and slots, latches or other elements via which the case 222 might be secured in a relatively fixed position to the cover 262, but which preferably permits the user to disengage the case 222 and cover 262 without the aid of tools.

In a preferred embodiment, the contacts 252-256 which are associated with the case 222 are recessed into the wall 228 thereof. This reduces the probability of the contacts 252-256 inadvertently contacting an outside element and causing a short or the like. At the same time, the contacts 278-282 associated with the cover 262 preferably extend outwardly from the wall 270 of the cover 262 to thereby extend into contact with the recessed contacts 2520-256 of the case 222.

The case 222 might include more than one stand or leg 260 or might include legs having other configurations than as specifically illustrated. It is also possible for the cover 262 to include one or more legs or stands.

As indicated, the case 222 may include more than one dock 249 and the cover 262 may include more than one port 274. In one embodiment, the case 222 includes a dock 249 at either side thereof so that when the case 222 is inserted into the cover 262, a dock 249 thereof will engage the port 274 of the cover 262 no matter which side of the case 222 is first inserted into the cover 262. Also, the dock(s) 249 and port(s) 274 may be centrally located on the walls 228/270 so that they align no matter whether the case 222 is inserted into the cover 262 right-side up or upside down.

In one embodiment, a logo may be located on the flap 266 or other portion of the cover 262. The logo may comprise an illuminated indicator which is connected to the controller 284. The logo or other indicator may illuminate when a case 222 is placed into contact with the cover 262. This may be used to indicate to a user that they have successfully docked their PED to the cover 262 (via the case 222) and that the PED is being charged (such as via the battery 272 or via an external power source). The logo might, for example, be configured to illuminate for a short period of time such as 5 seconds when such contact/insertion is detected by the cover 262.

The carrier 262 might include an external power connector. For example, the cover 262 might include one or more standard socket plugs which permit external power to be supplied to the cover 262 by plugging the contacts into a socket. The plugs might be connected to or through the controller 284. The plugs might be configured to move between a retracted position (such as where the plugs are folded into the body 264 of the cover 262) and an extended, use position (in which the plugs rotate or flip outward of the cover 262 to extended therefrom). In one embodiment, the plugs might be provided at the back of the cover 262. In order to facilitate connection of the plugs with a socket, the mount 290 may be removable by the user.

In one embodiment, the cover 262 might include one or more belt loops or other connectors (other than the mount 290 or in addition to the mount). The loops might be, for example, elements which cooperate with the body 264 to define passages through which a user may thread a belt or similar support. The loops might be connected to the back of the body 264 of the cover 262, such as on either side of the mount 290.

In one embodiment, the cover 262 might include a wireless communication signal booster. Such a booster may be part of the controller 284 or be associated with the controller 284. The booster may be configured as a powered signal booster which enhances the wireless communication range of the PED. For example, the booster may comprise a powered wireless communication interface which is associated with the controller 284 and which thus, via connection to the PED, enhanced the wireless communication range of the PED.

As indicated above, the case 222 and cover 262 may be constructed from a variety of materials. Preferably, the body of the case and cover are constructed from a relatively rigid material. The material may be opaque or transparent. In one embodiment, the flap 266 of the cover 262 may be transparent so as to permit a user to see a PED which is located inside of the cover 262.

As indicated above, in one embodiment the cover 262 preferably includes mating contacts which, when engaged, provide a power and data connection (such as between the cover 262 and a PED associated with the case 222 or an external device/location and the PED), via the cover 262. While the particular configuration of contacts described above is preferred and has numerous advantages, including ease of use, other types of connections might be utilized. For example, the cover might include one or more male connectors for selectively engagement with one or more female connectors which are associated with the PED. As one example, the case might include a multi-pin male connector which is configured to engage a multi-pin female connector of the PED when the PED is inserted into the case (rather than, for example, the mating (+) (−) (D) (−) (+) contacts as described and illustrated).

The carriers of the invention may have a variety of other features. As one example, the carrier might have an air quality sensor. For example, the carrier might have one or more sensors for smoke, carbon dioxide, carbon monoxide, radon, particulates or the like. Upon triggering of certain levels of such materials, the carrier might provide a warning, such as an audible sound or a light, or might provide an output to an associated PED (such as a textual warning that is presented on the display thereof).

As indicated above, the carrier may include at least one video projector, such as a pico-projector. The projector may be configured to project still or motion images upon a remote surface, such as a wall or the like. In this regard, the projector may include a lens or the like which faces outwardly from the carrier. The projector may be configured to receive data from a PED which is associated with the carrier. In this manner, a user may project images from their PED without having to have a separate projector.

In one embodiment, the carrier may include headphone or similar audio devices. For example, the carrier might include a pair of headphones or earbuds. Preferably, the headphones may move between a retracted position in which they are entirely or substantially housed within the carrier, to an extended position. In the retracted position, for example, cords of the headphones might be stored within the carrier.

Of course, the headphones might operate wirelessly as well. For example, the carrier might include a wireless communication interface, such as which implements a Bluetooth communication protocol, which may transmit and receive information from a wireless headset. Such a headset or similar device may be configured to receive instructions or input from a user and/or provide an output (such as sounds) to a user. The carrier may be configured to interface the headset to an associated PED. In this manner, a user might, for example, provide audio input to the PED via the carrier, such as during a telephone call.

The carrier might include a keyboard. The keyboard may connect to an associated PED, either through a wired or a wireless data connection. For example, the keyboard might connect to the PED using the Bluetooth® wireless communication protocol, or other protocols now known or later developed. In a preferred embodiment, the keyboard may be built in or connected to a side or other surface of the carrier.

In one embodiment, the carrier might include one or more buttons or touch sensitive areas, preferably on an exterior thereof. The button or touch sensitive area may be used to provide input to a PED. In one embodiment, the button or touch sensitive area might provide an input which silences the PED, such as to silence a ring-tone of the PED.

The carrier might also include one or more displays for displaying information. In one embodiment, a display might be configured to display text messages, caller identification or related information. For example, such information may be transmitted from a PED which is associated with the carrier. The display might comprise, for example, an electronic video display such as an LED, LCD or similar display.

The carrier might also include a near field communication (NFC) device. Such a device may be configured to communicate with an associated PED or with other devices which are located near the carrier. For example, using an NFC transmitter, a user might transmit information from their associated PED to a PED which is located nearby. The transmitted information might comprise, for example, text, audio files, video images, etc.

Likewise, the carrier might include other types of transmitters and/or receivers. For example, the carrier might include SD card, USB or similar devices having a communication port or communication capability. These devices may communicate with an associated PED but also create a wireless communication port between the carrier (and associated PED) and one or more third party devices. For example, such a device might enable the carrier to generate a WiFi hotspot, thus permitting multiple remote devices to exchange information with one another and/or a PED which is associated with the carrier.

As indicated above, the carrier might be configured with a power source, such as one or more solar panels. However, the carrier might include other power sources or generators. For example, the carrier might include a kinetic power generator. Such a generator may be configured to generate power (such as for charging one or more batteries of the carrier or for providing power to an associated PED), such as in response to movement of the carrier. For example, the kinetic power generator might generate power in response to shaking, vibration or other movement of the carrier.

In another embodiment, the carrier might include a resonant charger. Such a charger may be configured to generate energy due to interaction with an external device, such as when the external device is located proximate to the carrier, without the need for wires. Such a charger may be configured to generate power in response to location of the carrier adjacent to an external exciter, whereby the generated power can be used to power a PED or charge batteries of the carrier.

The carrier may include other acoustic elements. For example, the carrier might include one or more speakers or other audio generating devices. The speakers might be used to output audio signals which are generated by the carrier, such as audible warnings or notices. For example, carrier might generate an audible notice when a PED is docked or connected to it, when the carrier is connected to a power source, etc. However, the audio generating devices might also provide an output in response to information from the PED. For example, when a PED is connected to the carrier, an audio output of the PED may be provided to the carrier, thus causing the audio to be presented or output via the carrier.

The carrier might also include a natural acoustic enhancer. For example, the carrier might be shaped or include materials which enhance the audio output from an associated PED. Such a feature(s) may be used to improve the audio quality of the audio which is output by audio generating devices of the PED, increase the audio level thereof, etc.

Of course, these various features may be associated with the circuitry of the carrier, such as the controller 284 thereof, and may be powered by the one or more power sources of the carrier, such as solar panels, batteries or the like. As indicated, the controller 284 preferably includes an interface with a PED, whereby information from these features may be provided through the controller to the PED (for example, as indicated above, an air quality sensor might provide an output which is routed to through the controller to the PED to cause the PED to display a warning) or whereby information from the PED may be provided through the controller to the feature (for example, as indicated above, audio or visual information may be output from a PED through the controller to speakers or a projector of the carrier).

It will be appreciated that the location of the features and the number of the features may vary. For example, the features might be associated with the case and/or cover of the carrier in the embodiment of the invention illustrated in FIGS. 13-18.

It will be understood that the above described arrangements of apparatus and the method there from are merely illustrative of applications of the principles of this invention and many other embodiments and modifications may be made without departing from the spirit and scope of the invention as defined in the claims.

What is claimed is:

1. A charger for a portable electronic device comprising:
a case, said case comprising a case body having a case back, at least one case wall extending away from said case back and cooperating with said case back to generally define an interior case space, said interior case space having a generally open front, said case further comprising at least one connector configured to engage a data and power port of an associated personal electronic device and further comprising a dock comprising at least one external device contact, said at least one external device contact in communication with an associated personal electronic device via said connector; and
a cover, said cover comprising a cover body having a cover back, at least one cover wall extending away from said cover back and cooperating with said cover back to generally define an interior cover space, said interior cover space having a front, a flap attached to said cover body and movable between a first position in which said front of said interior cover space is accessible and a second position in which said flap closes said front of said interior cover space, at least one port for connection to said dock of said case when said case is located in said interior cover space of said cover, said at least one port linked to an external device port, and further comprising at least one power source; and
whereby when a personal electronic device is located in said case and said case is located in said cover, said personal electric device may be powered via said power source of said cover via connection of said power source to said personal electronic device through said connected port of said cover with said dock of said case, and whereby data may be transferred to and from said personal electronic device and an external device via a connection between said external device port of said cover and said external device and a communication path through said port to said dock of said cover to said personal electronic device.

2. A charger in accordance with claim 1, wherein said cover further comprises a mount that enables said cover to be removably coupled to a support element.

3. A charger in accordance with claim 1, wherein said cover comprises a plurality of ports such that said case is capable of being located in said cover in a plurality of orientations.

4. A charger in accordance with claim 1, wherein said case further comprises a retractable leg that is capable of supporting said case.

5. A charger in accordance with claim 1, wherein said cover further comprises at least one indicator light configured to indicate a charging status of said power source.

6. A charger in accordance with claim 1, wherein said case further comprises a first magnet and said cover further comprises a second magnet, wherein said first and second magnets are configured to be removably coupled.

7. A charger in accordance with claim 6, wherein said first and second magnets are disposed such that when said first and second magnets are removably coupled that said dock and said port are substantially aligned.

8. A case for use with a portable electronic device, said case comprising:
- a case body having a back, at least one wall extending away from said back and cooperating with said back to generally define an interior space that is sized to accommodate said portable electronic device;
- at least one connector configured to communicatively couple with an electronic port of said portable electronic device; and
- at least one dock comprising at least one external device contact, said at least one external device contact communicatively coupled with said at least one connector;
- said case configured to be removably coupled with a cover, said cover comprising:
  - a cover body that is sized to accommodate said case;
  - at least one port that is configured to communicatively couple with said at least one dock; and
  - a power source that is capable of providing power to said portable electronic device via said at least one port, said at least one dock, and said at least one connector when said electronic port of said portable electronic device is communicatively coupled with said at least one connector.

9. A case in accordance with claim 8, further comprising at least one aperture located within said at least one wall.

10. A case in accordance with claim 8, further comprising at least one retractable leg that is capable of supporting said case when extended.

11. A case in accordance with claim 10, further comprising a recess that is sized to accommodate said at least one retractable leg when retracted.

12. A case in accordance with claim 8, further comprising a plurality of docks such that said case may be located in said cover in a plurality of orientations and at least one of said plurality of docks is communicatively coupled with said at least one port.

13. A case in accordance with claim 8, further comprising a case magnet that is associated with said at least one dock and configured to removably couple with a cover magnet that is associated with said at least one port.

14. A case in accordance with claim 13, wherein said case magnet and said cover magnet are configured to substantially align said at least one dock and said at least one port when removably coupled.

15. A cover for use with a portable electronic device, said cover comprising:
- a cover body that is sized to accommodate a case, said case comprising:
  - a case body having a back, at least one wall extending away from said back and cooperating with said back to generally define an interior space that is sized to accommodate said portable electronic device;
  - at least one connector configured to removably couple with an electronic port of said portable electronic device; and
  - at least one dock comprising at least one external device contact, said at least one external device contact communicatively coupled with said at least one connector;
- at least one port that is configured to communicatively couple with said at least one dock;
- a controller communicatively coupled with said at least one port; and
- an external device port that is communicatively coupled with said controller such that the controller is capable of facilitating data transmission between said at least one connector of said case and said external device port of said cover.

16. A cover in accordance with claim 15, wherein said cover further comprises a video projector that is configured to display video from said personal electronic device.

17. A cover in accordance with claim 15, wherein said cover further comprises a near field communication device.

18. A cover in accordance with claim 15, wherein said external device port is a Universal Serial Bus type connector.

19. A cover in accordance with claim 15, further comprising a plurality of ports that is each configured to communicatively couple with said at least one dock and said controller.

20. A cover in accordance with claim 15, further comprising a flap that is movable between a first position and a second position, said flap sized to substantially cover said case when in said second position.

* * * * *